(12) United States Patent
Kim

(10) Patent No.: US 7,706,188 B2
(45) Date of Patent: *Apr. 27, 2010

(54) FLASH MEMORY PROGRAM INHIBIT SCHEME

(75) Inventor: Jin-Ki Kim, Ottawa (CA)

(73) Assignee: MOSAID Technologies Incorporated, Ottawa, Ontario (CA)

( * ) Notice: Subject to any disclaimer, the term of this patent is extended or adjusted under 35 U.S.C. 154(b) by 0 days.

This patent is subject to a terminal disclaimer.

(21) Appl. No.: 12/371,088

(22) Filed: Feb. 13, 2009

(65) Prior Publication Data

US 2009/0147569 A1    Jun. 11, 2009

Related U.S. Application Data

(63) Continuation of application No. 11/565,170, filed on Nov. 30, 2006, now Pat. No. 7,511,996.

(51) Int. Cl.
G11C 16/04 (2006.01)

(52) U.S. Cl. .............. 365/185.17; 365/185.02; 365/185.18; 365/185.25; 365/185.28

(58) Field of Classification Search ............ 365/185.02, 365/185.17, 185.18, 185.25, 185.28
See application file for complete search history.

(56) References Cited

U.S. PATENT DOCUMENTS

| | | | |
|---|---|---|---|
| 5,473,563 A | 12/1995 | Suh et al. | |
| 5,546,341 A | 8/1996 | Suh et al. | |
| 5,729,683 A | 3/1998 | Le et al. | |
| 5,969,990 A | 10/1999 | Arase | |
| 6,061,270 A * | 5/2000 | Choi ................ | 365/185.02 |
| 6,107,658 A | 8/2000 | Itoh et al. | |
| 6,230,233 B1 | 5/2001 | Lofgren et al. | |
| 6,453,365 B1 | 9/2002 | Habot | |
| 6,456,528 B1 | 9/2002 | Chen | |
| 6,504,757 B1 * | 1/2003 | Hollmer et al. ........ | 365/185.18 |
| 6,594,183 B1 | 7/2003 | Lofgren et al. | |
| 6,614,688 B2 | 9/2003 | Jeong et al. | |
| 6,717,847 B2 | 4/2004 | Chen | |

(Continued)

OTHER PUBLICATIONS

Hara, T. et al., "A 146mm2 8Gb NAND Flash Memory with 70nm CMOS Technology", ISSCC Session 2 Non-Volatile Memory 2.1, IEEE International Solid-State Circuits Conference, Feb. 2005, pp. 44, 45 and 584.

(Continued)

*Primary Examiner*—Hoai V Ho
(74) *Attorney, Agent, or Firm*—Shin Hung; Borden Ladner Gervais LLP

(57) ABSTRACT

A method for minimizing program disturb in Flash memories. To reduce program disturb in a NAND Flash memory cell string where no programming from the erased state is desired, a local boosted channel inhibit scheme is used. In the local boosted channel inhibit scheme, the selected memory cell in a NAND string where no programming is desired, is decoupled from the other cells in the NAND string. This allows the channel of the decoupled cell to be locally boosted to a voltage level sufficient for inhibiting F-N tunneling when the corresponding wordline is raised to a programming voltage. Due to the high boosting efficiency, the pass voltage applied to the gates of the remaining memory cells in the NAND string can be reduced relative to prior art schemes, thereby minimizing program disturb while allowing for random page programming.

17 Claims, 17 Drawing Sheets

U.S. PATENT DOCUMENTS

| | | | |
|---|---|---|---|
| 6,807,106 | B2 | 10/2004 | Gonzales et al. |
| 7,023,739 | B2 | 4/2006 | Chen et al. |
| 7,161,833 | B2* | 1/2007 | Hemink .................. 365/185.18 |
| 7,196,930 | B2 | 3/2007 | Han et al. |
| 7,221,592 | B2 | 5/2007 | Nazarian |
| 7,304,894 | B2 | 12/2007 | Joo |
| 7,486,557 | B2 | 2/2009 | Kim et al. |
| 2002/0006059 | A1 | 1/2002 | Gerber et al. |
| 2002/0161941 | A1 | 10/2002 | Chue et al. |
| 2005/0254309 | A1 | 11/2005 | Kwon et al. |
| 2007/0019474 | A1* | 1/2007 | Kim et al. .............. 365/185.18 |

OTHER PUBLICATIONS

Byeon, D. et al., "An 8Gb Multi-Level NAND Flash Memory with 63nm STI CMOS Process Technology", ISSCC Session 2 Non-Volatile Memory 2.2, IEEE International Solid-State Circuits Conference, Feb. 2005, pp. 46 and 47.

Tanzawa, T. et al., "Circuit Techniques for a 1.8-V-Only NAND Flash Memory", IEEE Journal of Solid-State Circuits, vol. 37, No. 1, Jan. 2002, pp. 84-89.

Saito, et al., "A Programmable 80ns 1Mb CMOS EPROM", IEEE ISSCC Digest of Technical Papers, Feb. 14, 1985, pp. 176-177, 340.

Ohtsuka, N. et al., "A 4-Mbit CMOS EPROM", IEEE Journal of Solid-State Circuits, vol. 22, Issue 5, Oct. 1987, pp. 669-675.

Takeuchi, K. et al., "A multipage cell architecture for high-speed programming multilevelNAND flash memories", IEEE Journal of Solid-State Circuits, vol. 33, Issue 8, Aug. 1998, pp. 1228-1238.

Tanzawa, et al., "A dynamic analysis of the Dickson charge pump circuit;" IEEE J. Solid-State Circuits, vol. 32, No. 8, Aug. 1997, pp. 1231-1240.

Imamiya, K. et al., "A 125-mm2 1-Gb NAND Flash Memory with 10-MByte/s Program Speed", IEEE Journal of Solid-State Circuits, vol. 37, No. 11, Nov. 2002, pp. 1493-1501.

Jung, T. et al., "A 117-mm2 3.3-V Only 128-Mb Multilevel NAND Flash Memory for Mass Storage Applications," IEEE Journal of Solid-State Circuits, vol. 31, No. 11, Nov. 1996, pp. 1575-1583.

Tomita, N. et al., "A 62-ns 16-Mb CMOS EPROMm with Voltage Stress Relaxation Technique" IEEE Journal of Solid-State Circuits vol. 26, No. 11, Nov. 1991, pp. 1593-1599.

Cho, T. et al., "A Dual Mode NAND Flash Memory: 1-Gb Multilevel and High-Performance 512-Mb Single-Level Modes", IEEE Journal of Solid-State Circuits, vol. 36, No. 11, Nov. 2001, pp. 1700-1706.

Aritome, S. et al., "A Reliable Bi-Polarity Write/Erase Technology in Flash EEPROMS", Int'l Electron Devices Meeting, 1990, Technical Digest, Dec. 9-12, 1990, pp. 111-114.

Shirota, R., et al., "A 2.3um2 Memory Cell Structure for 16Mb NAND EEPROMs", International Electron Devices Meeting 1990, Technical Digest, (1990), pp. 103-106.

June Lee et al., "A 90-nm CMOS 1.8-V 2-Gb NAND Flash Memory for Mass Storage Applications," IEEE J Solid-State Circuits, vol. 38, No. 11, pp. 1934-1942, Nov. 2003.

Lee, S. et al., "A 3.3V 4Gb Four-Level NAND Flash Memory with 90nm CMOS Technology", ISSCC 2004/Session 2 Non-Volatile Memory/2.7, IEEE International Solid-State Circuits Conference, Feb. 15-19, 2004, Digest of TechnicalPapers, pp. 52-513, vol. 1, XP010722148, ISBN: 0-7803-8267-6.

Takeuchi, K. et al, "A 56nm CMOS 99mm2 8Gb Multi-level NAND Flash Memory with 10MB/s Program Throughput", Solid-State Circuits, 2006 IEEE International Conference Digest of Technical Papers, Feb. 6-9, 2006, ISBN:1-4244-0079-1.

Samsung Electronics Co. Ltd, "256M×8 Bit / 128 M×16 Bit / 512M×8 Bit NAND Flash Memory", K9K4G08U1M, May 6, 2005, pp. 1-41.

Samsung Electronics Co. Ltd, "512M×8 Bit / 1G×8 Bit NAND Flash Memory", K9XXG08UXA, May 7, 2006, pp. 1-43.

Samsung Electronics Co. Ltd, "1G×8 Bit / 2G×8 Bit / 4G×8 Bit NAND Flash Memory", K9XXG08UXA, Jul. 18, 2006, pp. 1-50.

Gal, et al., "Algorithms and data structures for flash memories", ACM Computing Surveys (CSUR), vol. 37, No. 2, p. 138-163, Jun. 2005, Tel Aviv University.

Samsung Electronics Co. Ltd, "2G×8 Bit NAND Flash Memory", K9GAG08U0M, Apr. 12, 2006, pp. 1-48.

Toshiba, "16 GBIT (2G×8 Bit) CMOS NAND E2PROM (Multi-Level-Cell)", TC58NVG4D1DTG00, Nov. 9, 2006.

Toshiba, "2GBit (256M×8 Bits) CMOS NAND E2PROM", TH58NVG1S3AFT05, May 19, 2003.

R. Kirisawa, S, Aritome, R. Nakayama, T. Endoh, R. Shirota and F. Masuoka, "A NAND structured cell with a new programming technology for high reliable 5 V-only flash EEPROM," Symp. VLSI Technol, Dig. Tech. Papers, pp. 129-130, Jun. 1990.

M. Momodomi, T. Tanaka, Y. Iwata, Y. Tanaka, H. Oodaira, Y. Itoh, R. Shirota, K. Ohuchi and F. Masuoka, "A 4-Mbit NAND EEPROM with tight programmed Vt distribution," IEEE J Solid-State Circuits, vol. 26, No. 4, pp. 492-496, Apr. 1991.

Tomoharu Tanaka, et al., "A Quick Intelligent Page-Programming Architecture and a Shielded Bitline Sensing Method for 3 V-Only NAND Flash Memory," IEEE J Solid-State Circuits, vol. 29, No. 11, pp. 1366-1373, Nov. 1994.

Kang-Deog Suh et al., "A 3.3 V 32 Mb NAND Flash Memory with Incremental Step Pulse Programming Scheme," IEEE J Solid-State Circuits, vol. 30, No. 11, pp. 1149-1156, Apr. 1995.

Jin-Ki Kim et al., "A 120-mm 64-Mb NAND Flash Memory Achieving 180 ns/Byte Effective Program Speed," IEEE J Solid-State Circuits, vol. 32, No. 5, pp. 670-680, Apr. 1997.

June Lee et al., "High-Performance 1-Gb NAND Flash Memory With 0.12um Technology," IEEE J Solid-State Circuits, vol. 37, No. 11, pp. 1502-1509, Nov. 2002.

* cited by examiner

FLASH MEMORY PROGRAM INHIBIT SCHEME

CROSS REFERENCE TO RELATED APPLICATIONS

This application is a Continuation Application from U.S. patent application Ser. No. 11/565,170, filed Nov. 30, 2006, now issued as U.S. Pat. No. 7,511,996.

FIELD OF THE INVENTION

The present invention relates generally to non-volatile memory. In particular, the present invention relates to non-volatile Flash memory programming schemes.

BACKGROUND OF THE INVENTION

Numerous types of consumer electronics products rely on some form of mass storage for retaining data or software for the execution of code by a microcontroller. Such consumer electronics are prolific, and include devices such as personal digital assistants (PDA's), portable music players, portable multimedia players (PMP's) and digital cameras. In PDA's, mass storage is required for storing applications and data, while portable music players and digital cameras require large amounts of mass storage for retaining music file data and/or image data. The mass storage solution for such portable electronics is preferably small in size, consumes minimal power, and has high storage density. This limits the selection to non-volatile forms of memory since volatile memories, such as static random access memory (SRAM) and dynamic random access memory (DRAM), require a constant application of power in order to retain data. As is known in the art, portable electronics rely on batteries that have a finite power supply. Therefore, non-volatile memories that retain data after power is removed are preferred.

While many consumer products use commodity Flash memory, Flash memory is indirectly used by consumers in products such as cell phones and devices with microprocessing functions. More specifically, the application specific integrated circuits (ASIC) commonly found in consumer electronics can have integrated Flash memory to enable firmware upgrades. Needless to say, Flash memory is versatile due to its optimal balance in size, storage density, and speed, making it a preferred non-volatile mass storage solution for consumer electronics.

FIG. 1 is a general block diagram of typical Flash memory of the prior art. Flash memory 10 includes logic circuitry for controlling various functions of the Flash circuits, registers for storing address and data, high voltage circuits for generating the required program and erase voltages, and core memory circuits for accessing the Flash memory array. The functions of the shown circuit blocks of Flash memory 10 should are well known in the art. Persons skilled in the art will understand that Flash memory 10 shown in FIG. 1 represents one possible Flash memory configuration among many possible configurations.

A read operation is a relatively straight-forward access of data stored at a particular memory location of the memory array, called an address. Prior to a write operation to a specific block of the memory array, the specific block must first be erased with the application of high voltages. A write operation, more accurately called a program operation, requires the careful application of high voltages to a selected memory location, followed by a program verify operation to ensure that the data has been properly programmed. Furthermore, since high voltages are used, the Flash chip must be designed to be relatively tolerant to inadvertent programming of non-selected memory cells.

FIGS. 2a, 2b and 2c are illustrations of the NAND memory cell string used in memory cell array 28. FIG. 2a is a circuit schematic of two NAND memory cell strings. FIG. 2b is a chip layout of the two NAND memory cell strings shown in FIG. 2a. FIG. 2c is a cross-sectional view of one NAND memory cell string shown in FIG. 2b along line A-A'. Each NAND memory cell string includes 32 serially connected floating gate memory cells 50 each connected to respective wordlines WL0 to WL31, a string select transistor 52 connected between the bitline 54 and the first floating gate memory cell 50, and a ground select transistor 56 connected between a common source line (CSL) 58 and the last floating gate memory cell 50. The gate of string select transistor 52 receives a string select signal SSL, while the gate of ground select transistor 56 receives a ground select signal GSL. The NAND memory cell strings share common wordlines, string select SSL, and ground select GSL signal lines. The construction and arrangement of the shown NAND memory string is well known in the art.

As previously mentioned, the NAND memory cell strings of the memory array are first erased, according to well known techniques in the art. Each block of NAND memory cell strings can be selectively erased, therefore one or more blocks can be simultaneously erased. When successfully erased, all erased floating gate memory cells 50 will have a negative threshold voltage. In effect, all erased memory cells 50 are set to a default logic state, such as a logic "1", for example. Programmed memory cells 50 will have their threshold voltages changed to a positive threshold voltage, thus representing the opposite "0" logic state.

FIG. 3 shows a threshold voltage (Vt) distribution graph for erased memory cells and programmed memory cells. Due to process and voltage supply variations, the erased and programmed threshold voltages will be distributed within a voltage range. As shown in FIG. 3, erased memory cells can have a negative threshold voltage between −3V to −1V, while programmed memory cells can have a positive threshold voltage between 1V and 3V. Generally, a cell is programmed by applying a high voltage to its gate while keeping its source and drain terminals grounded. The high electrical field causes electrons in the memory cell channel to cross the gate oxide and embed in the floating gate (known as Fowler-Nordheim (F-N) Tunneling), thereby increasing the effective threshold voltage of the memory cell.

A brief discussion of how data is read from the NAND memory cell string now follows with reference to FIGS. 2a to 2c. To read data one memory cell 50, SSL and GSL are both set to a read voltage (Vread, typically higher than Vcc), of 5V for example, to turn on string select transistor 52 and ground select transistor 56. All wordlines except the wordline to be accessed are set to a read voltage (Vread), of 5V for example, while the wordline to be accessed is set to 0V. Therefore, all memory cells 50 having a threshold lower than 5V are turned on to couple the source and drain terminals of the selected memory cell having the 0V wordline, to the bitline 54 and the source line 58. If the selected memory cell is in the erased state (having a negative threshold voltage), it will turn on, thereby coupling the bitline 54 to the source line 58. On the other hand, if the selected memory cell in the programmed state (having a positive threshold voltage), it will not turn on, thereby isolating the bitline 54 from the source line 58. The presence or absence of current is then detected by sense amplifiers.

The aforementioned reading scheme will reliably access memory cell data if the erased and programmed threshold voltages remain within their respective ranges. However, the described situation is ideal and the threshold voltages of erased and programmed memory cells can potentially shift when memory cells are programmed.

Programming is typically done by the page, meaning that all the memory cells 50 in the block connected to the same wordline are selected to be programmed with write data (logic "0") at the same time. The remaining memory cells are thus unselected during programming. Since the memory cells start in the erased state (logic "1") prior to programming, only the memory cells to be programmed with the logic "0" should be subjected to the high electric fields necessary to promote F-N tunneling. However, due to the physical connections of the memory array, all the memory cells along the same wordline receive the same high voltage programming level. As a result, there is a potential that erased memory cells will have their threshold voltages unintentionally shifted. This is called program disturb, which is well known in the Flash memory field.

Therefore a program inhibit scheme is used for preventing those memory cells where no change from the erased state is required, from being programmed to the logic "0" state. There are two known program inhibit schemes that can be used. The first is a basic inhibit scheme and the second is a self-boosted inhibit scheme. Table 1 summarizes the voltages applied to the relevant signal lines of FIG. 2a for both schemes. It is assumed that all the memory cells 50 connected to WL27 are erased to the logic "1" state, and BL0="0" and BL1="1" data is to be written to the memory cells 50 accessed by wordline WL27.

TABLE 1

|  | Basic inhibit | Self-boosted inhibit |
| --- | --- | --- |
| BL0 | 0 V (VSS) | 0 V (VSS) |
| BL1 | VPI (8 V for example) | VCC (2.5 V for example) |
| WL27 | VPGM (18 V for example) | VPGM (18 V for example) |
| WL0-WL26, WL28-31 | VPASS (10 V for example) | VPASS (10 V for example) |
| SSL | VPASS (10 V for example) | VCC (2.5 V for example), then 0 V |
| GSL | 0 V (VSS) | 0 V (VSS) |

For the basic inhibit scheme, VPGM is set to a sufficiently high program voltage to cause F-N tunneling with drain voltage of 0V on the selected cell. VPASS is set sufficiently high to render unselected cell transistors in the selected string conductive regardless of their programmed state, and to pass VPI to the memory cell where no programming is desired. At the same time, VPASS should be insufficiently high to initiate F-N tunneling on unselected cells. VPI is an inhibit voltage on BL1 set sufficiently high to inhibit F-N tunneling on the selected cell connected to WL27, since the voltage difference between VPGM and VPI in the channel of the memory cell connected to WL27 is now too small.

There are some problems with the basic inhibit scheme. VPI is provided by an internal high voltage generator during program operations, and a large capacity charge pump is required to supply VPI to the highly capacitive bitlines. This leads to a drastic increase in the power consumption and the chip size, which are both highly undesirable. Page buffers connected to the bitlines must now be configured for high voltage operation in order to provide VPI to the bitlines. High voltage transistors are larger than regular voltage transistors, which increase the page buffer size and consequently, the chip size. Programming speed is reduced due to the need to charge the highly capacitive bitlines to VPI, with the on-chip voltage generator which has a limited current supply.

The self-boosted inhibit scheme addresses the problems of the basic inhibit scheme. With the SSL transistors 52 turned on and the GSL transistors 56 turned off, 0V or ground voltage, is applied to bitline BL0, while a high voltage such as VCC is applied to bitline BL1. A 0V bitline (as in BL0) ties the channel of the associated NAND string to ground. When the program voltage VPGM is applied to the gate of the selected cell, the large potential difference between gate and channel results in F-N tunneling of electrons onto the floating gate, thereby programming the cell. In program inhibited cells, BL1 initially precharges the associated channels towards the VCC voltage. When the voltage of WL27 rises to VPGM, and the remaining wordlines reach VPASS, the series capacitances through the control gate, floating gate, channel, and bulk are coupled and the channel potential is automatically boosted.

This boosting occurs when the coupled channel voltage rises to Vcc-Vth (where Vth is the threshold voltage of the SSL transistor). At this point, the SSL transistor 52 turns off and the channel becomes a floating node. It has been calculated that the floating channel voltage rises to approximately 80% of the gate voltage, which is sufficiently high to prevent F-N tunneling from occurring.

However, program disturb can still occur. In particular, if VPASS is set to be too high, erased cells coupled to BL0 can be unintentionally soft programmed to the logic "0" state due to the relatively high difference in voltage between VPASS and the 0V channel. On the other hand, if VPASS is set to be too low, the erased memory cell connected to WL27 and coupled to BL1 may not receive sufficient channel boosting to inhibit F-N tunneling.

Unfortunately, with continued scaling down due to advances in semiconductor fabrication technology, the power supply VCC is also scaled to a lower level. This is disadvantageous for the self-boosted inhibit scheme. This is because the NAND cell string channel is initially precharged to Vcc-Vth of the SSL transistor 52 before self-boosting by VPGM and VPASS, and the boosted voltage is largely affected by the precharge voltage Vcc-Vth. Furthermore, to achieve higher packing density, designers are increasing the number of memory cells in each NAND string. Therefore, relative to a NAND string having 16 memory cells 50, the 32 memory cell NAND string shown in FIGS. 2a to 2c will endure twice as many program disturb cycles than a 16 memory cell NAND string.

Accordingly, the threshold of programmed and erased memory cells can be unintentionally shifted during programming operations. FIG. 4 shows threshold voltage (Vt) distribution graph for program disturbed erased memory cells and programmed memory cells. The solid curves correspond to the threshold distribution originally shown in FIG. 3, while the dashed curves show the shifted threshold distribution due to program disturb. This shifting can be due to accumulated number times a cell is disturbed, or a single program disturb event. This is very problematic as the shifted thresholds can affect read operations. As previously discussed for a read operation, the gate of a selected memory cell 50 is driven to 0V, while unselected memory cells receives a read voltage Vread at its gate, while unaccessed memory cells have their gates driven to a read voltage Vread. As shown in FIG. 4, the 0V level may not turn on those cells having threshold voltages shifted above 0V. Furthermore, unselected cells having their thresholds shifted over the Vread voltage will remain off, thereby isolating the accessed memory cell from its corresponding bitline.

One technique for minimizing program disturb is to reduce the voltage level of VPASS. This introduces an operational constraint on the Flash memory, whereby the memory cells of the NAND string must be programmed in a sequential pattern, starting from the memory cell farthest from the bitline. In this scheme, all memory cells in the NAND string between the memory cell being programmed (selected page) and the bitline contact must be in the erased state. Hence a lower VPASS voltage can be used for non-selected cells to ensure that the bitline voltage can be coupled to the selected memory cell in the NAND string. Unfortunately, no random page program operations can be executed, since programmed memory cells (having Vth higher than VPASS for example) between the selected memory cell and the bitline contact will impede the bitline voltage from reaching the selected memory cell. This random page program prohibition causes many restrictions and performance degradation in certain applications.

It is, therefore, desirable to provide a program inhibit scheme that minimizes program disturb in NAND Flash memory cells. More specifically, it is desirable to provide a program inhibit scheme where the VPASS voltage level can be reduced for minimizing program disturb in unselected memory cells where programming is undesired, while maximizing the boosted channel voltage of the selected memory cell where programming is undesired.

SUMMARY OF THE INVENTION

It is an object of the present invention to obviate or mitigate at least one disadvantage of previous Flash memory program disturb inhibit schemes. In particular, it is an object of the present invention to provide a NAND Flash memory program disturb inhibit scheme that minimizes pass disturbance of unselected memory cells during random programming operations.

In a first aspect, the present invention provides a method for minimizing program disturb in NAND string. The NAND string includes a selected memory cell, upper memory cells between the selected memory cell and a bitline, and lower memory cells between the selected memory cell and a sourceline, and a string select transistor for coupling the memory cells to the bitline. The method includes the steps of coupling a voltage level to the NAND string; precharging a channel under the selected memory cell and the upper memory cells; and locally boosting the selected memory cell channel. The voltage level corresponds to program inhibit data from the bitline. The channel under the selected memory cell and the upper memory cells are precharged to a primary boosted voltage level after the voltage level is coupled to the channel of the NAND string. The selected memory cell channel is locally boosted to a secondary boosted voltage level after the channel is precharged, the secondary boosted voltage level being higher than the primary boosted voltage level.

According to an embodiment of the aspect, the voltage level corresponding to program inhibit data is coupled to the bitline in a first time period, the channel is precharged in a second time period following the first time period, the selected memory cell channel is locally boosted in a third time period following the second time period, and the step of locally boosting includes driving a selected wordline connected to the selected memory cell to a programming voltage level. In an aspect of the present embodiment, the step of coupling can include driving the string select transistor to a first voltage level in the first time period, followed by driving the string select transistor to a decoupling voltage level in the second time period. The decoupling voltage level can be lower than the first voltage level. In another aspect of the present embodiment, the step of precharging can include driving the selected wordline cell and upper wordlines connected to the upper memory cells to a first pass voltage level. The first pass voltage can have a value effective for minimizing program disturb in the upper memory cells and for maximizing the primary boosted voltage level. The first pass voltage can be less than 10 volts, but a 7 volt pass voltage can be used.

In a further aspect of the present embodiment, wherein the step of locally boosting includes electrically turning off the upper memory cell adjacent to the selected memory cell. The step of electrically turning off can include reducing the upper wordline adjacent to the selected wordline from the first pass voltage level to a decoupling voltage level while the selected wordline is driven to the programming voltage level. Alternately, the selected wordline can be driven to the programming voltage level after the upper memory cell adjacent to the selected memory cell is turned off. More specifically, the selected wordline can be driven to the programming voltage at a delay time after the upper wordline begins to drop towards the decoupling voltage. Alternately, the step of electrically turning off can include raising the upper wordlines except the upper wordline adjacent to the selected wordline, from the first pass voltage level to a second pass voltage while the selected wordline is driven to the programming voltage level, and the upper wordline adjacent to the selected wordline can be maintained at the first pass voltage level.

In yet another aspect of the present embodiment, the step of precharging can include driving lower wordlines connected to the lower memory cells to a second pass voltage, where the second pass voltage is less than the first pass voltage. The step of locally boosting can include reducing the lower wordline adjacent to the selected wordline from the second pass voltage to an off voltage level while the selected wordline is driven to the programming voltage level. Alternately, the step of precharging can include driving lower wordlines connected to the lower memory cells except for the lower wordline adjacent to the selected wordline to a second pass voltage, the lower wordline adjacent to the selected wordline being maintained at an off voltage level during the first time period, the second time period and the third time period. In all the previous embodiments, the programming voltage level can be iteratively increased by predetermined voltage steps while maintaining the first pass voltage level and the second pass voltage level.

In a second aspect, the present invention provides a method for minimizing program disturb in a Flash memory NAND string. The NAND string can have a selected memory cell, upper memory cells between the selected memory cell and a bitline, lower memory cells between the selected memory cell and a source line, and a string select transistor for coupling the memory cells to the bitline. The method includes a) driving the string select transistor for coupling data voltage of the bitline to the NAND string in a first time period; b) driving the upper memory cells and the selected memory cell with a pass voltage level in a second time period; c) driving the selected memory cell to a program voltage level in a third time period; and d) electrically turning off the upper memory cell adjacent to the selected memory cell in the third time period.

According to embodiments of the present aspect, the step of driving the upper memory cells includes driving the lower memory cells except the lower memory cell adjacent to the selected memory cell with a second pass voltage level in the second time period, where the second pass voltage level is lower than the pass voltage. The step of electrically turning off can include driving an upper memory cell adjacent to the selected memory cell from the pass voltage level to a decoupling voltage while the selected memory cell is driven to the programming voltage level in the third time period. The selected memory cell can be driven to the programming voltage level at a delay time after the upper memory cell adjacent to the selected memory cell starts to be driven to the decoupling voltage. Alternately, the step of electrically turning off can include driving the upper memory cells except an upper memory cell adjacent to the selected memory cell from the pass voltage to a second pass voltage in the third time period, where the second pass voltage is greater than the pass voltage. The program voltage level can be iteratively increased by predetermined voltage steps while maintaining the pass voltage level and the off voltage level.

According to further embodiments, the lower memory cell can be driven to 0V during the second time period, and the step of driving the upper memory cells can include driving the lower memory cells with a second pass voltage level in the second time period, the second pass voltage level being lower than the pass voltage. A lower memory cell adjacent to the selected memory cell can be driven with an off voltage level in the third time period.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIG. 2b is plan view layout of the two NAND memory cell strings shown in FIG. 2a;

FIG. 7b is a sequence diagram further illustrating the sequence of the voltages being applied to the NAND string of FIG. 7a;

DETAILED DESCRIPTION

Generally, the present invention provides a method and system for minimizing program disturb in Flash memories. To reduce program disturb in a NAND Flash memory cell string where no programming from the erased state is desired, a local boosted channel inhibit scheme is used. In the local boosted channel inhibit scheme, the selected memory cell in a NAND string where no programming is desired, is locally decoupled from the other cells in the NAND string. This allows the channel of the decoupled cell to be locally boosted to a voltage level sufficient for inhibiting F-N tunneling when the corresponding wordline is raised to a programming voltage. Due to the high boosting efficiency, the pass voltage applied to the gates of the remaining memory cells in the NAND string can be reduced relative to prior art schemes, thereby minimizing program disturb while allowing for random page programming.

Figure 5:
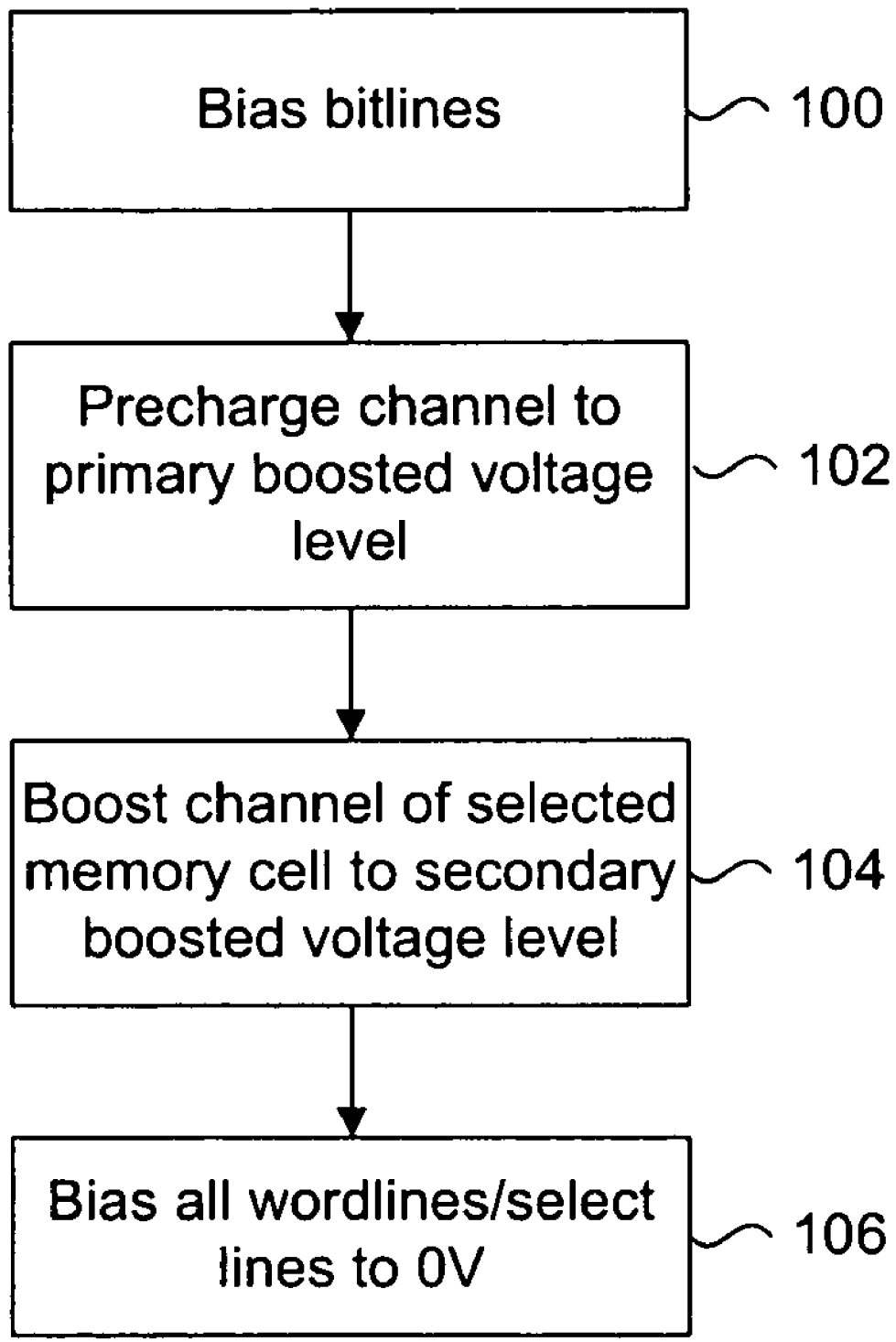
FIG. 5 is a flow chart illustrating a general program inhibit method according to an embodiment of the present invention.

FIG. 5 is a flow chart illustrating a general program inhibit method according to an embodiment of the present invention. It should be understood that while a selected memory cell of one NAND string is being programmed, a selected memory cell of another NAND string can be inhibited from being programmed. The bitline is biased with a program inhibit voltage at step 100, which corresponds to a logic "1" state. Then at step 102, the channel of the NAND string is pre-charged to a primary boosted voltage level. This can be done by driving all the wordlines to a pass voltage. At step 104, the channel of a selected memory cell is locally boosted to a secondary boosted voltage level when the corresponding wordline is driven to a programming voltage. This can be done by decoupling, or isolating, the selected memory cell from the rest of the NAND string by controlling the wordline voltage of the memory cells immediately adjacent to the selected memory cell. For the NAND string where programming is to be inhibited, this corresponds to a localized boosting phase where the channel of the selected memory cell is boosted to a level sufficient to inhibit F-N tunneling. The sequence ends at step 106 where all the wordlines and the select lines, such as SSL are driven to 0V.

Figure 6:
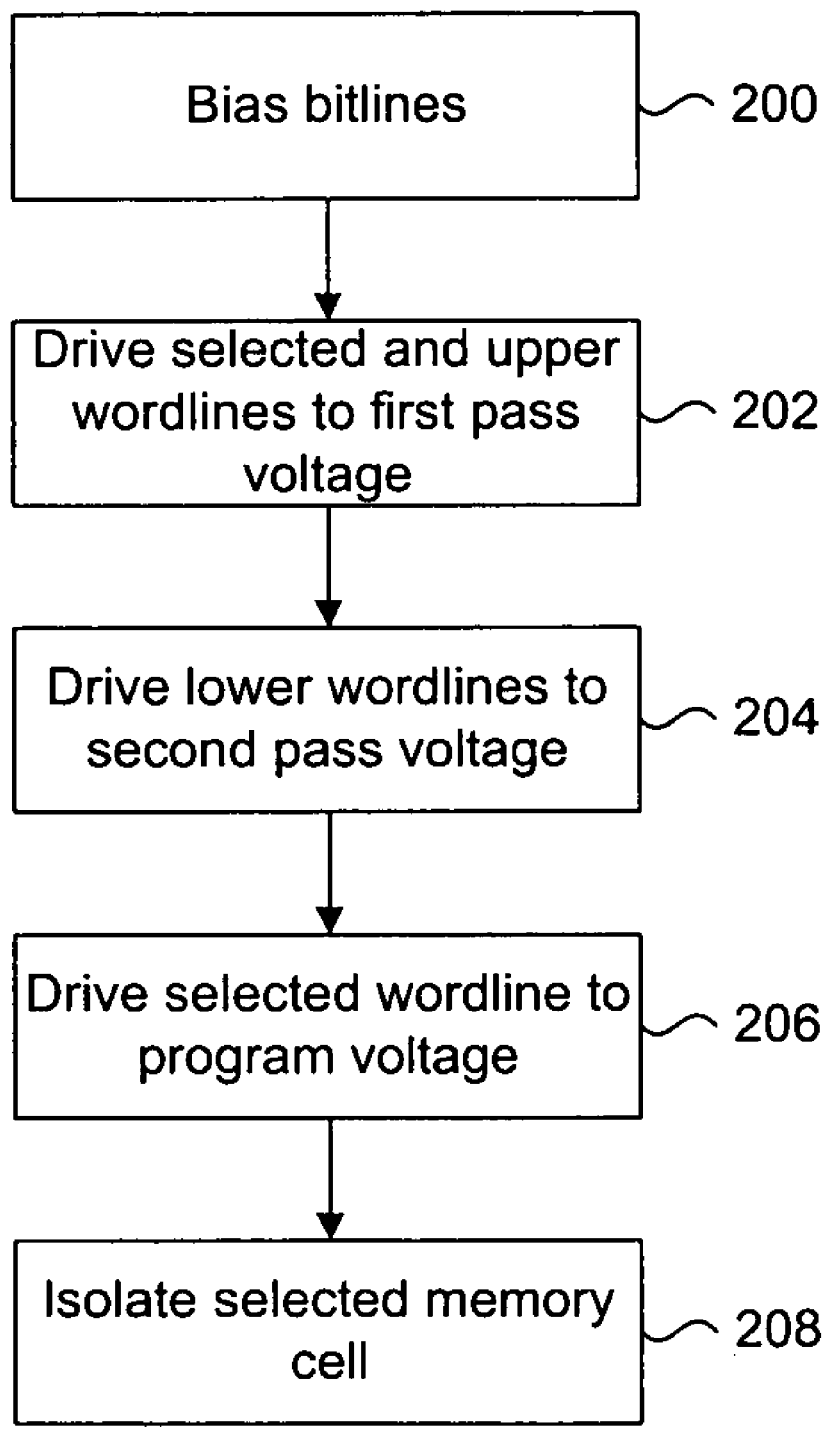
FIG. 6 is a flow chart illustrating an embodiment of the general program inhibit method, according to an embodiment of the present invention.

FIG. 6 is a flow chart illustrating an embodiment of the program inhibit method shown in FIG. 5. In the present discussion, upper wordlines refer to those wordlines and memory cells between the selected memory cell and the bitline, while lower wordlines refer to those wordlines and memory cells between the selected memory cell and the sourceline. The program inhibit method of FIG. 6 begins at step 200, where the bitlines are biased with an inhibit voltage or a program voltage. In the presently described example, it is presumed that the bitline is driven to an inhibit voltage of VCC. At step 202, the selected wordline and the upper wordlines are driven to a first pass voltage. This first pass voltage is high enough to turn on each memory cell corresponding to an upper wordline, regardless of its programmed or unprogrammed state. Concurrently with step 202, the lower wordlines are driven to a second pass voltage at step 204. According to embodiments of the present method, the first pass voltage and the second pass voltage can be identical to each other, or the second pass voltage can be lower than the first pass voltage. The selected wordline is then driven to a programming voltage at step 206, followed by an isolation operation at step 208 for decoupling the selected memory cell from the unselected memory cells of the NAND string. As will be described later, there are different techniques for isolating the selected memory cell. According to another embodiment of the present invention, a memory cell connected to a lower wordline can be turned off for reducing charge leakage from the selected memory cell.

Figure 1:
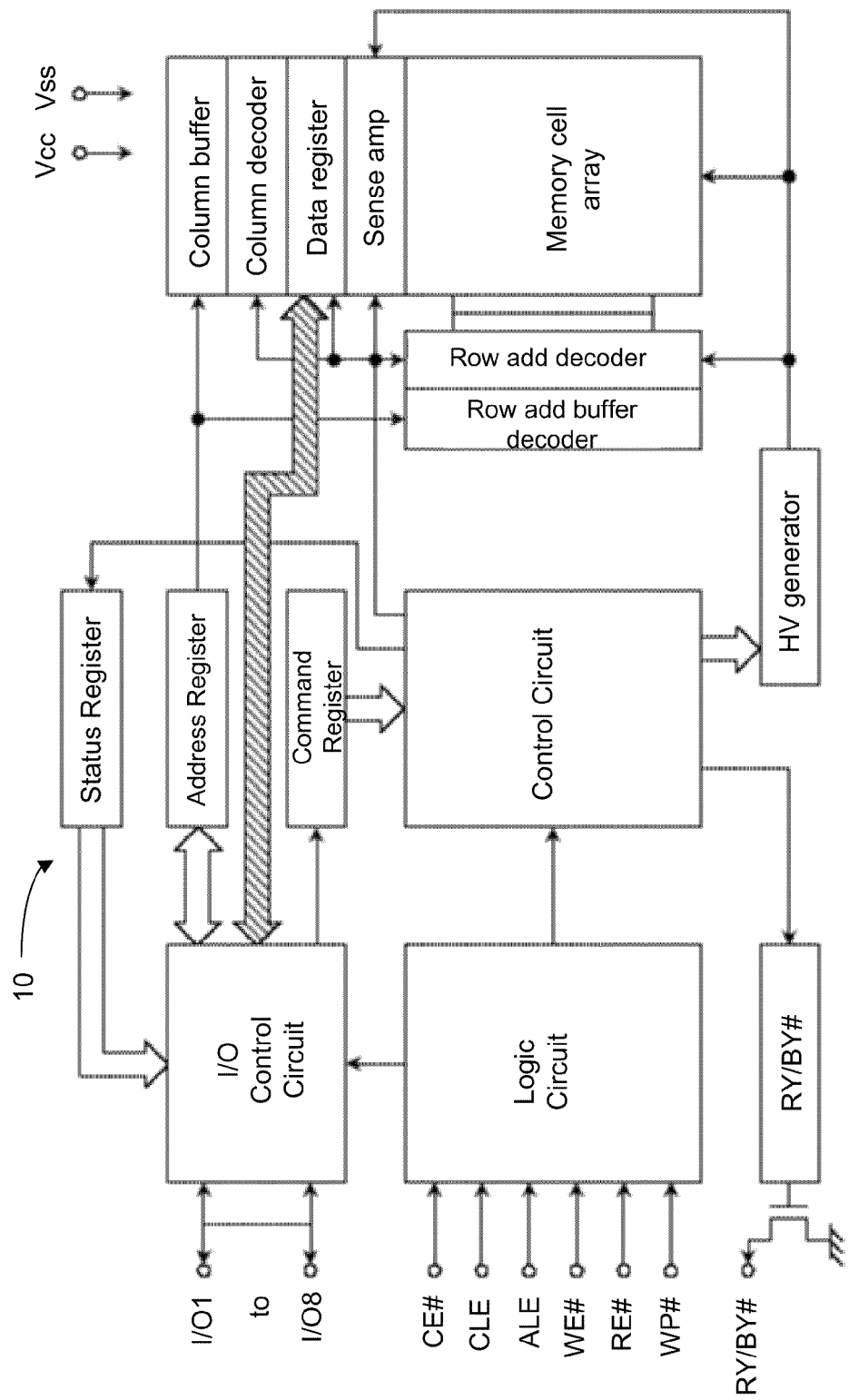
FIG. 1 is a block diagram of typical Flash memory.
Figure 2A:
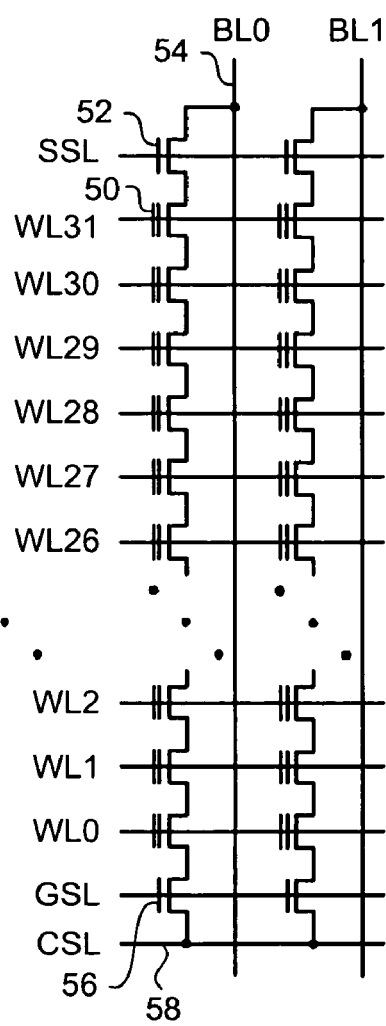
FIG. 2a is a circuit schematic of two NAND memory cell strings.
Figure 2B:
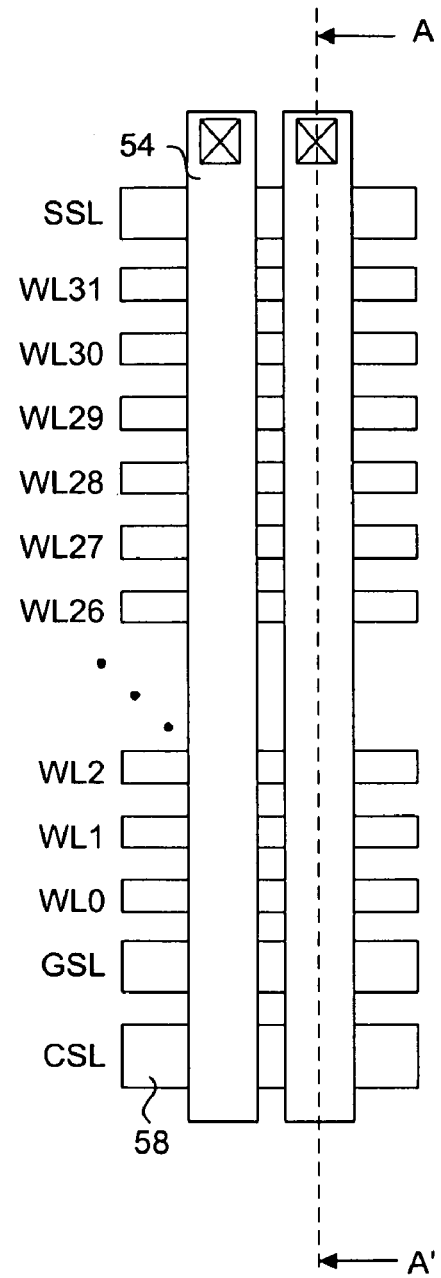
Figure 2C:
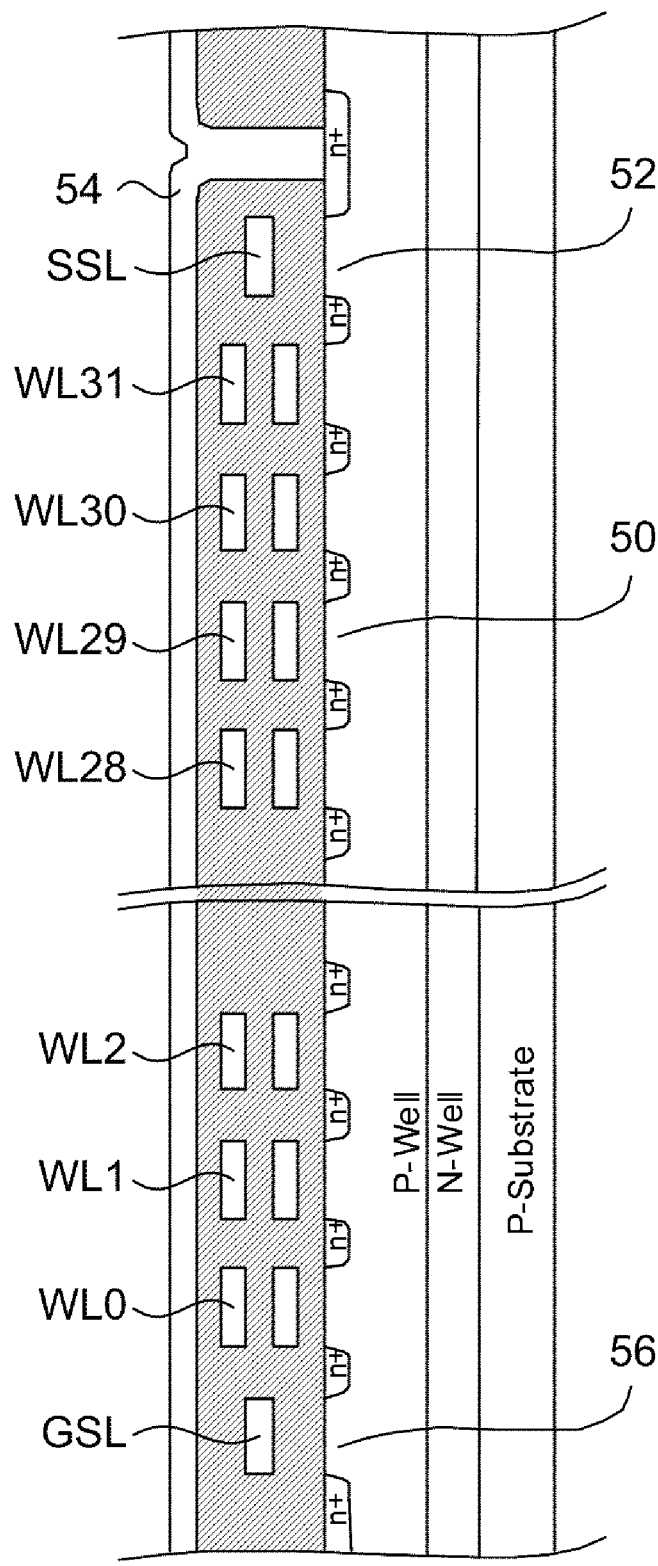
FIG. 2c is a cross-sectional view of one NAND memory cell string shown in FIG. 2b along line A-A'.
Figure 3:
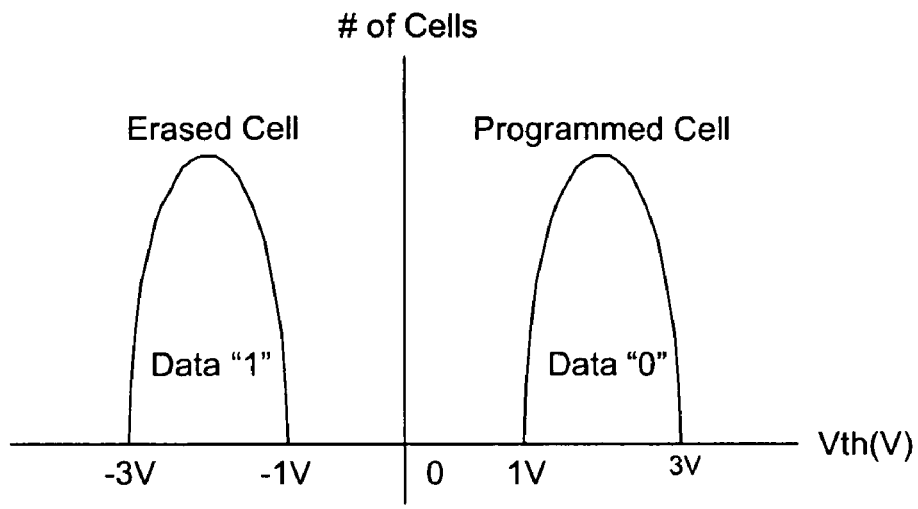
FIG. 3 is a threshold voltage (Vt) distribution graph for erased memory cells and programmed memory cells.
Figure 4:
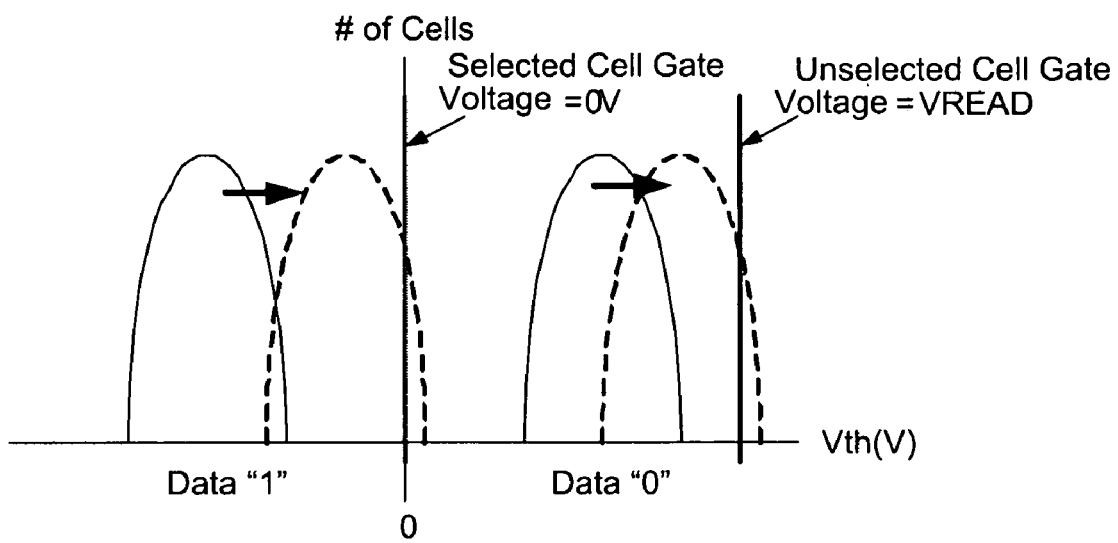
FIG. 4 is a threshold voltage (Vt) distribution graph for erased memory cells and programmed memory cells after being program disturbed.
Figure 7A:
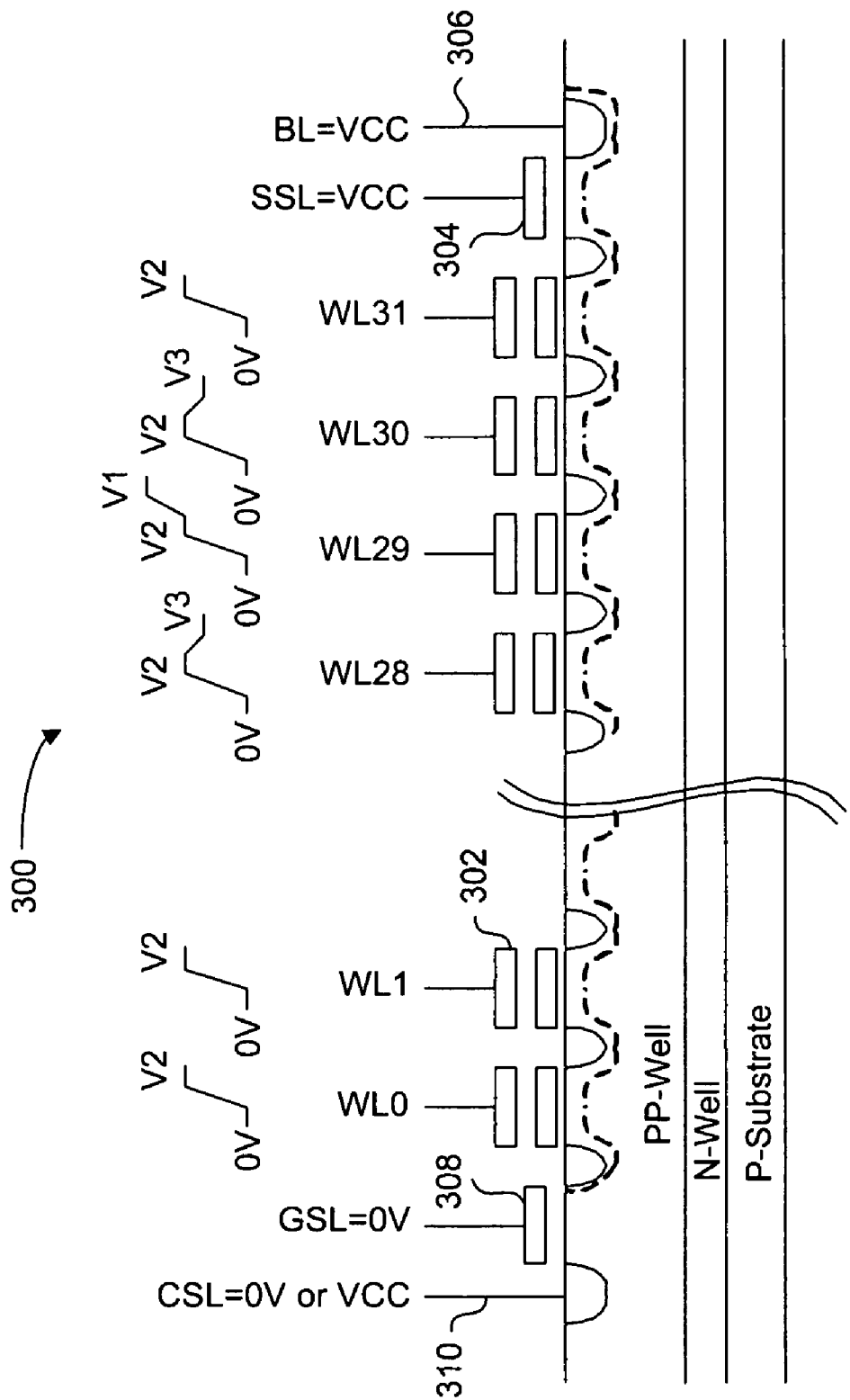
FIG. 7a is a simplified cross sectional view of a NAND string showing applied gate voltages during the program inhibit method, according to an embodiment of the present invention.

FIG. 7a is a simplified cross sectional view of a NAND string 300, similar to the one shown in FIG. 2b. NAND string 300 includes memory cells 302 having gates connected to wordlines WL0 to WL31, a string select transistor 304 for coupling the NAND string 300 to a bitline 306, and a ground select transistor 308 for coupling the NAND string 300 to a source line 310. The NAND string 300 is formed within a PP-Well, which is itself formed within an N-Well of the P-substrate. The source/drain regions of the NAND string memory cell transistors are n+ diffusion regions.

Figure 7B:
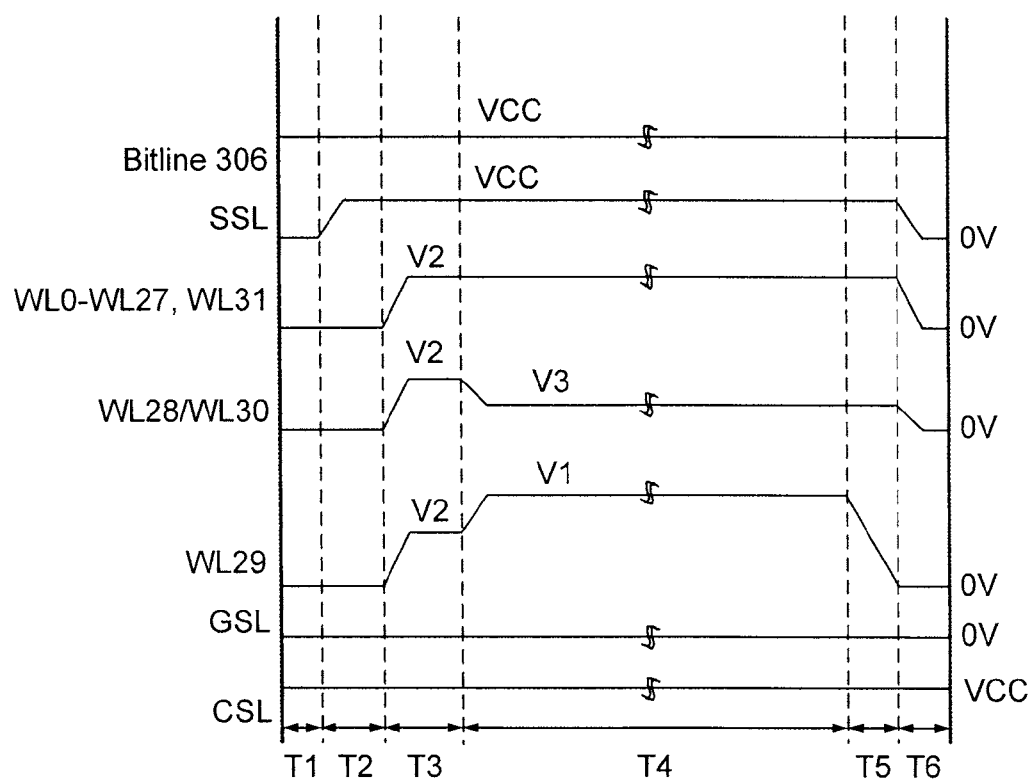

FIG. 7a includes annotations to show relative voltage levels applied to specific wordlines, according to an embodiment of the present invention. It is noted that the physical NAND string remains unchanged from the prior art. In the example shown in FIG. 7a, it is assumed that the memory cell connected to WL29 is selected for programming, and the data to be programmed is the logic "1" state. Since the erased state is a logic "1", programming is to be inhibited. FIG. 7b is a sequence diagram further illustrating the sequence of the voltages being applied in FIG. 7a.

Time period T1 is an initial state, where the gates of all the memory cells 302, signal SSL, and signal GSL are biased to 0V, while the bitline voltages for programming memory cells and for inhibiting programming of memory cells are applied. CSL can be biased to either 0V or VCC, but can be preferably biased to VCC in the present example to minimize leakage. In the present example, bitline 306 is biased to VCC. At time period T2, signal SSL is biased to VCC for coupling the bitline voltage to NAND string 300. In NAND string 300 shown in FIG. 7a, string select transistor 304 electrically turns off because its drain terminal connected to the bitline 306 and its gate are both biased to VCC. More specifically, string select transistor 304 will turn off once its source rises to about VCC minus a threshold voltage of the transistor. Time periods T1 and T2 correspond to step 100 in FIG. 5. During time period T3, which corresponds to step 102 in FIG. 5, all the wordlines (upper, lower and selected wordlines) are driven to a pass voltage V2, where V2 is selected to be higher than VCC. This has the effect of boosting the entire channel of NAND string 300 to the primary boosted voltage. At the beginning of time period T4, the selected wordline WL29 is raised to the programming voltage V1 while the adjacent wordlines WL28 and WL30 are reduced to a decoupling voltage V3. These correspond to steps 104 and 106 respectively in FIG. 5. The voltage level of V1 is set to be higher than V2, and the voltage level of V3 is set to be lower than V1 and V2.

A further advantage of reducing the wordline voltage of WL28 and WL30 to V3 is to compensate for capacitive coupling between the control gate connected to WL29 and the floating gates coupled to WL28 and WL30. As WL29 is driven to V1, the capacitive coupling effect can increase the floating gate voltage, thereby increasing the probability of pass disturbance in the memory cells immediately adjacent to the selected memory cell. Therefore, the reduction of the wordline voltage to V3 will reduce the floating gate voltage.

In the embodiment shown in FIG. 7a the voltage levels of V1, V2 and V3 should be selected according to the following criteria. V1 should be a voltage level high enough to promote F-N tunneling in a memory cell coupled to a bitline biased to 0V. The voltage level of V2 should be selected to satisfy the following three criteria. First, V2 should be high enough to ensure that the channels of unselected cells are made to be conductive. Second, when the voltage V2 falls down to the voltage V3 for WL28 and WL30 during time period T4, the memory cells connected to WL28 and WL30 are turned off and remain turned-off during time period T4. This is the local decoupling effect that is achieved. Third, when the selected wordline WL29 rises to the program voltage V1 from voltage V2, the channel of the selected cell can be boosted to a desired voltage, namely to the secondary boosted voltage level. V3 should be a voltage level high enough to pass a 0V bitline voltage through unselected cells to the drain of a selected cell, while being sufficiently low to substantially turn off the channels of the memory cells (connected to WL28 and WL30) immediately adjacent the selected cell (connected to WL29).

A significant advantage of the present program inhibit scheme is that the voltage level of V2 can be reduced relative to the analogous VPASS voltage of the prior art to minimize program disturb in unselected memory cells, while being sufficiently high to pass 0V on a bitline through the unselected memory cells that have been previously programmed to the logic "0" state.

Now that the relative levels of voltages V1, V2 and V3 and the application sequence thereof have been described according to a generic embodiment of the invention, following is a description of example values which can be used. Table 2 lists example voltage values for the embodiment shown in FIG. 7a, based on a particular process technology.

TABLE 2

| Parameter | Voltage |
| --- | --- |
| VCC | 2.5 V |
| Vth_ssl (Threshold voltage of 304) | 0.8 V |
| γ (Cell coupling ratio) | 0.8 |
| V1 | 18 V |
| V2 | 7 V |
| V3 | 5 V |
| Vthc (worst case logic "0" programmed cell voltage threshold voltage) | 3 V |

With these values, the primary boosted voltage level for the NAND string channel 300 and the secondary boosted voltage level for the selected memory cell where no programming is desired, can be calculated. The string select transistor 304 is electrically turned off when its source terminal reaches VCC−Vth, due to a gate voltage of VCC and a drain voltage (connected to bitline 306) of VCC. Thus VCC−Vth_ssl is an initial channel voltage Vich (i.e. starting voltage) for channel boosting.

The primary boosted voltage level (Vprimary) of the channel is calculated according to equation (1) below:

$$V\text{primary} = V\text{ich} + \gamma^*(V\text{unsel} - V\text{thc} - V\text{ich}), \quad (1)$$

where Vunsel is the gate voltage applied to an unselected memory cell, and Vich=VCC−Vth_ssl.

The secondary boosted voltage level Vsecondary of the selected memory cell is calculated according to equation (2) below:

$$V\text{secondary} = V\text{ich} + \gamma^*(V\text{sel} - V\text{thc} - V\text{ich}), \quad (2)$$

where Vsel is the gate voltage applied to a selected memory cell, and Vich=VCC−Vth_ssl.

Vsecondary in equation (2) can be alternately expressed in equation (3) below:

$$V\text{secondary} = V\text{primary} + \gamma^*(V\text{sel} - V\text{unsel}), \text{ provided} \\ V\text{unsel} > V\text{thc} + V\text{ich and } V\text{sel} > V\text{unsel} \quad (3)$$

A description of the sequence diagram of FIG. 7b follows with the application of the example values of Table 2. With bitline 306 set to 2.5V (VCC), signal SSL rising to 2.5V (VCC) during time period T2 will cause the channel voltage of NAND string 300 to rise to Vich of about 1.7V. When the wordlines all rise to 7V (V2) during time period T3, the channel of NAND string 300 is raised to the primary boosted voltage level of:

$$V\text{primary} = 1.7V + 0.8^*(7V - 3V - 1.7V) = 3.54V$$

During time period T4, the selected wordline rises to 18V (V1), while the two adjacent unselected wordlines WL28 and WL30 fall to 5V (V3). Since unselected cells, except the memory cells connected to WL28 and WL30, retain the boosted channel voltage of 3.54V in T3, the memory cells connected to WL28 and WL30 will be electrically turned off as the gate of the selected cell rises to 18V (V1). Thus the channel of the selected cell is decoupled from the rest of NAND string 300, and the channel boosting on the selected cell is localized. Localized channel boosting is more efficient than the prior art channel boosting scheme, thereby providing a higher boosted channel voltage. The resultant secondary boosted voltage level is approximately:

$$V\text{secondary} = 3.54V + 0.8(V1 - V2) = 12.34V,$$

Hence, this secondary boosted voltage level is high enough to prevent the selected cell from being programmed. That is, the secondary boosted voltage is sufficiently high for the selected cell to retain its erased state under the V1 program voltage of 18V. In described embodiments, the ratio of the secondary boosted voltage level vs the program voltage V1 is at least about 70%.

The previously described program inhibit sequence applies for any selected memory cell having adjacent memory cells, since the adjacent memory cells can be turned off to decouple the selected memory cell from the rest of the NAND string. However, the NAND string 300 includes the end memory cells connected to wordlines WL0 and WL31 which do not have a second adjacent memory cell. Following is a discussion of the program inhibit sequence when either end memory cell is to be inhibited from being programmed.

Figure 8:
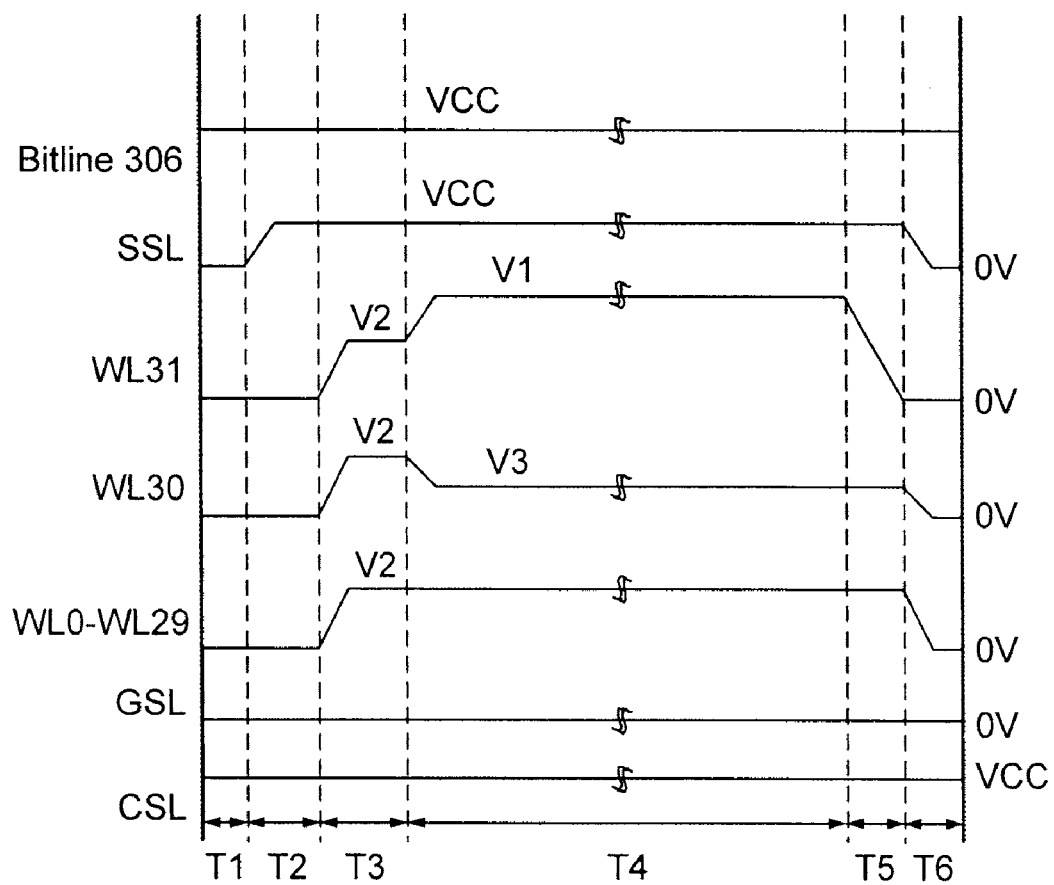
FIG. 8 is a sequence diagram illustrating the program inhibit sequence according to an embodiment of the present invention.

FIG. 8 is a sequence diagram illustrating the program inhibit sequence when the memory cell connected to wordline WL31 is to be driven to the programming voltage V1. Immediately adjacent to the memory cell connected to WL31 is the memory cell connected to WL30, and the string select transistor 304 connected to signal SSL. As in the sequence of FIG. 7b, bitline 306 is biased to VCC and SSL rises to VCC during time period T2. String select transistor 304 eventually turns off as the coupled channel voltage rises to VCC−Vth_ssl. During time period T3 all the wordlines rise to V2 to raise the channel of NAND string 300 to the primary boosted voltage level. Wordline WL31 rises to V1 and adjacent wordline WL30 falls to V3 during time period T4 to turn off its respective memory cell. Since string select transistor 304 is already turned off, the memory cell connected to WL31 is decoupled from the NAND string 300, and its channel is locally boosted to the second boosted channel voltage level.

Figure 9:
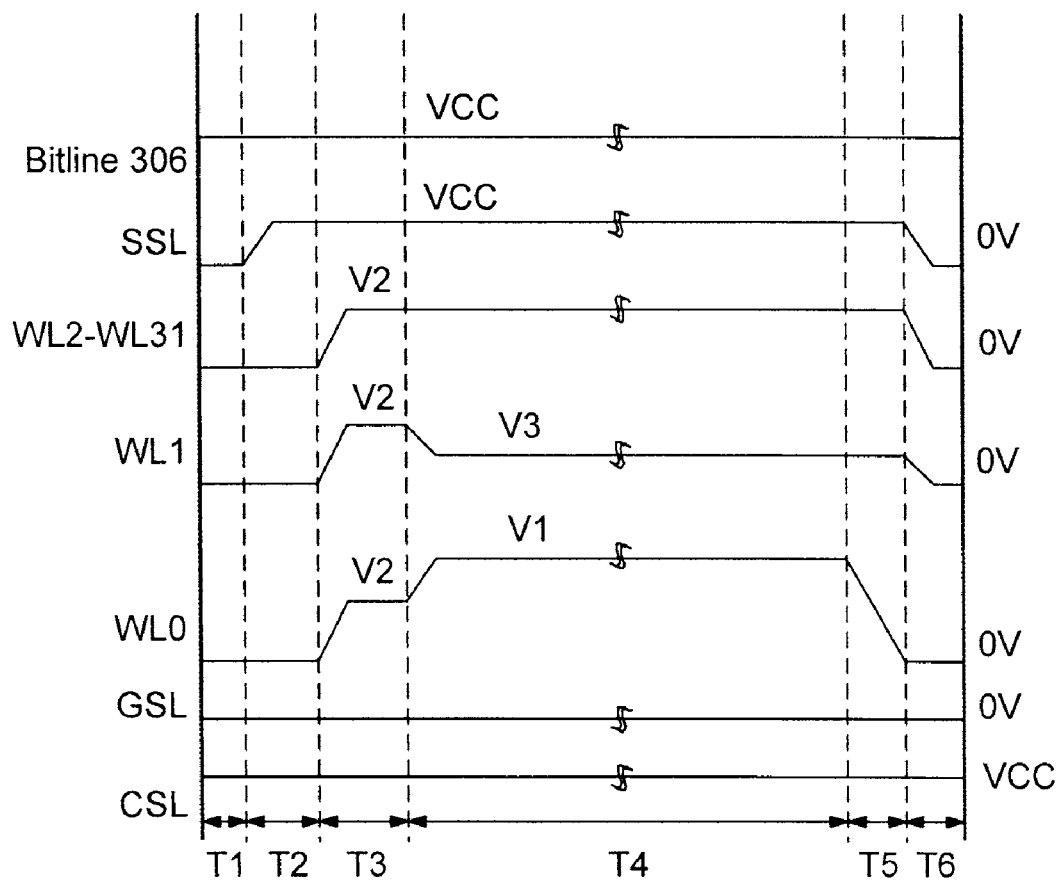
FIG. 9 is a sequence diagram illustrating the program inhibit sequence according to another embodiment of the present invention.

FIG. 9 is a sequence diagram illustrating the program inhibit sequence when the memory cell connected to wordline WL0 is to be driven to the programming voltage V1. Immediately adjacent to the memory cell connected to WL0 is the memory cell connected to WL1, and the ground select transistor 308 connected to signal GSL. GSL is biased to 0V in the initial state during time period T1 while bitline 306 is biased to VCC. SSL rises to VCC during time period T2, and all the wordlines rise to V2 to raise the channel of NAND string 300 to the primary boosted voltage level during time period T3. Wordline WL0 rises to V1 and adjacent wordline WL1 falls to V3 during time period T4 to turn off its respective memory cell. Since ground select transistor 308 is already turned off, the memory cell connected to WL1 is decoupled from the NAND string 300, and its channel is locally boosted to the second boosted channel voltage level.

As shown in FIGS. 7b to 9, the selected memory cell in a NAND string where no programming is desired can be decoupled from the rest of the NAND memory cells by controlling the sequence and voltages being applied to the unselected memory cells and the select transistors.

During time period T3 in FIGS. 7b to 9, the channel of the NAND string 300 can leak charge to the bitline through capacitive coupling between WL31 and string select transistor 304. This has the effect of reducing the primary boosted voltage level. Therefore, according to an embodiment of the present invention, signal SSL can be reduced from VCC to a leakage minimization voltage V4. By example, for the NAND string 300 shown in FIG. 7a, V4 can be 1V. By dropping SSL to V4, the channel of string select transistor 304 becomes more resistant to leaking charge to bitline 306. V4 is can be selected to be at a level sufficient to pass a 0V level on a bitline to the selected memory cell to be programmed.

Figure 10:
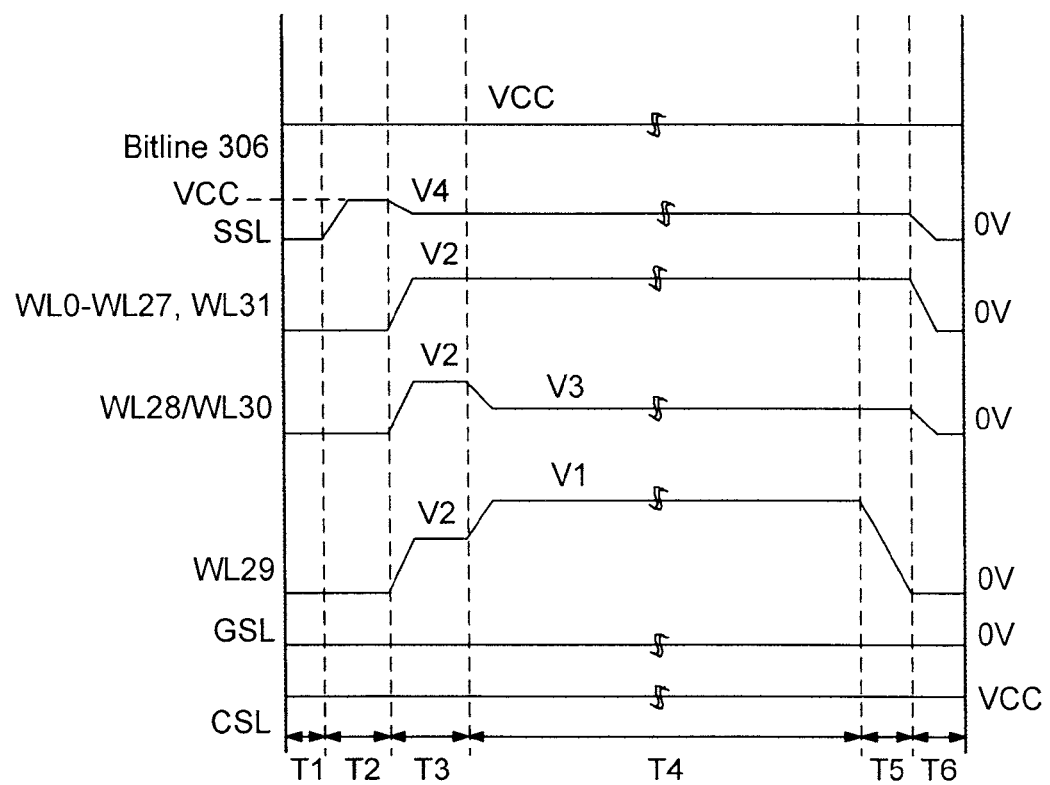
FIG. 10 is a sequence diagram illustrating the program inhibit sequence of FIG. 7b modified to minimize channel leakage.

FIG. 10 is a sequence diagram illustrating the program inhibit sequence of FIG. 7b modified to minimize channel leakage. At the initial state during time period T1, the gates of all the memory cells 302, signal SSL, and signal GSL are biased to 0V, while bitline voltage (VCC) is applied and CSL is biased to VCC. At time period T2, signal SSL is biased to VCC for coupling the bitline voltage to NAND string 300. In NAND string 300 shown in FIG. 7a, string select transistor 304 is turned off because its drain terminal connected to the bitline 306 and its gate are both biased to VCC. More specifically, string select transistor 304 will turn off once its channel rises to about VCC minus a threshold voltage of the transistor. During time period T3, all the wordlines are driven to a pass voltage V2 for boosting the entire channel of NAND string 300 to the primary boosted voltage. However, to minimize leakage of the primary boosted voltage to bitline 306, SSL is reduced to voltage V4 as the wordlines are driven to V2. At the beginning of time period T4, the selected wordline WL29 is raised to the programming voltage V1 while the adjacent wordlines WL28 and WL30 are reduced to a decoupling voltage V3. The SSL voltage reduction to the leakage minimization voltage V4 can be used in the program inhibit sequences shown in FIGS. 8 and 9 with equal effectiveness.

The local secondary boosted voltage level of the selected memory cell where no programming is desired can be further increased, according to another embodiment of the present invention. In the previous program inhibit sequence embodiments shown in FIGS. 7a to 10, all the wordlines are driven to the V2 pass voltage during time period T3, after which, only the selected wordline is driven from V2 to the program voltage V1. The local secondary boosted voltage level can be maximized when the difference between V2 and V1 is maximized. Hence, according to an embodiment of the present invention, the voltage level of V2 for the selected wordline is reduced relative to the previously shown program inhibit sequences.

Figure 11:
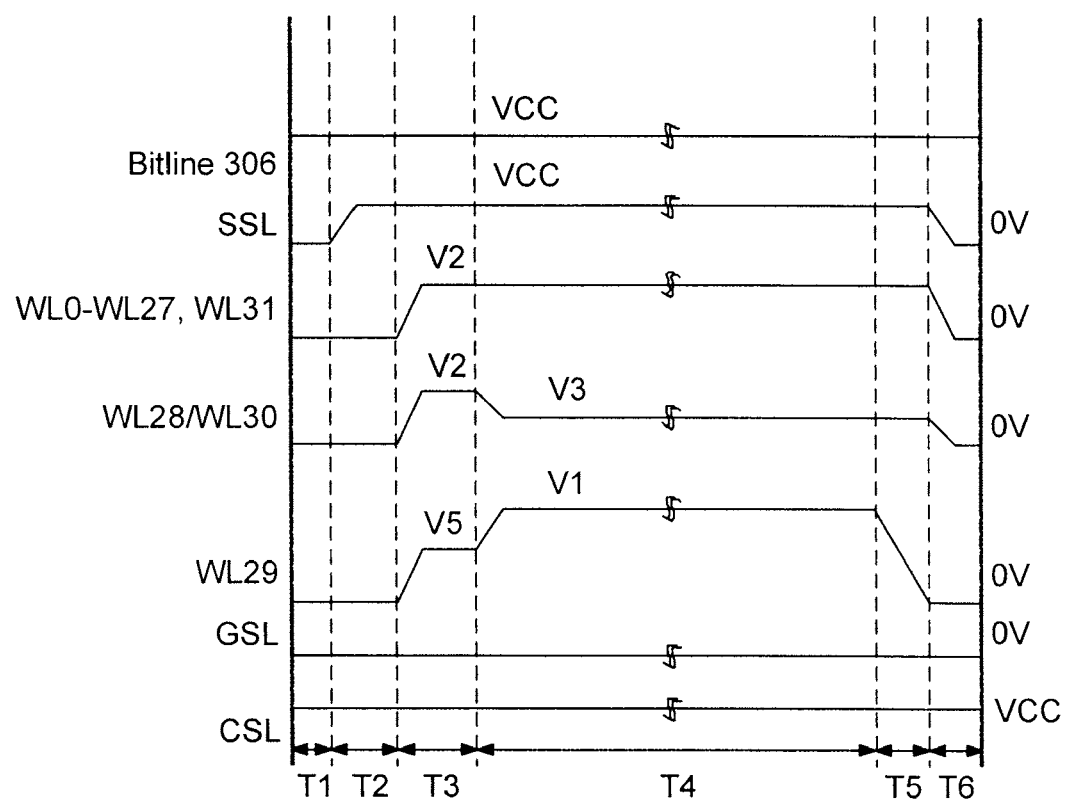
FIG. 11 is a sequence diagram illustrating the program inhibit sequence of FIG. 7b modified to maximize the local secondary boosted voltage level.

FIG. 11 is a sequence diagram illustrating the program inhibit sequence of FIG. 7b modified to maximize the local secondary boosted voltage level in the channel of the selected transistor where programming is to be inhibited. As shown during time period T3, all the wordlines are driven to the V2 pass voltage except for the selected wordline WL29, which is driven to a lower voltage of V5. Subsequently in time period T4, WL29 is driven to the programming voltage V1. For the NAND string 300 shown in FIG. 7a, V5 can be set to a voltage level of 5V, for example. It is noted that V5 is selected to be sufficiently high to ensure conductivity of the channel of the selected cell during time period T3. Therefore, since the difference between V5 and V1 is greater than the difference between V2 and V1, a higher local secondary boosted voltage level can be obtained in the selected memory cell. This is referred to as the high differential local boosting scheme.

The following relational expressions summarize the relative constraints of the voltage levels used in the previously described embodiments of the invention.

$$V3 < V2 < V1 \quad (1)$$

$$0V < V4 < V3 \quad (2)$$

$$0V < V5 < V2 \quad (3)$$

The actual values depend on memory cell and transistor geometry, and the process being used. V1 is a programming voltage sufficient for inducing F-N tunneling. V2 is a pass voltage i) high enough for making the memory cells conductive; ii) high enough such that a drop to V3 will turn off the memory cells it is connected to; iii) high enough such that an increase to V1 will locally boost the selected memory channel to the desired secondary boosted voltage level. V2 can be higher than VCC. V3 is high enough to pass a 0V bitline voltage, and should be at least as high as the worst case threshold voltage of a programmed memory cell. In Table 1 for example, if Vthc is 3 volts, then V3 should be at least 3 volts.

Figure 12:
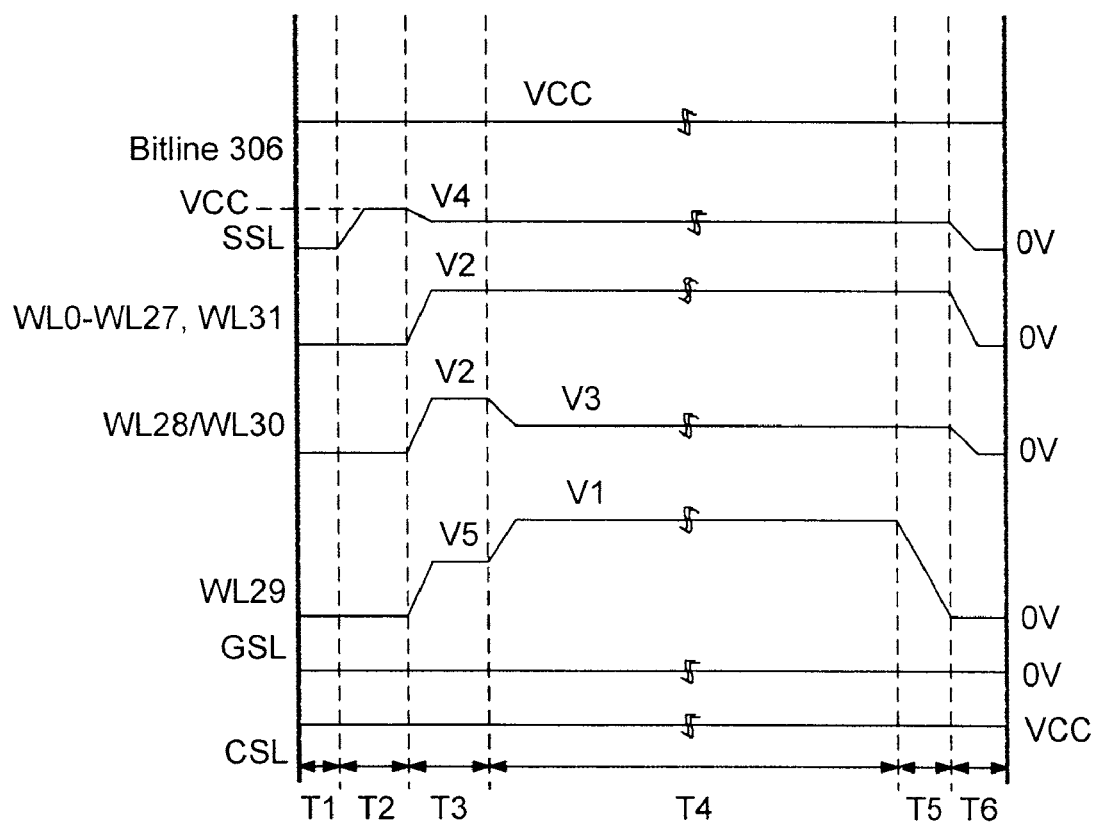
FIG. 12 is a sequence diagram illustrating the program inhibit sequence according to another embodiment of the present invention.

Various program inhibit sequences according to embodiments of the present invention have been shown in FIGS. 7b to 11. Embodiments have been shown for reducing leakage or for increasing the secondary boosted voltage level during programming operations. These embodiments can be combined together to attain all the benefits each individual scheme has to offer. As shown in the sequence diagram of FIG. 12, the SSL signal can be reduced to the leakage minimization voltage V4 during time period T3 while the selected wordline WL29 is set to a reduced pass voltage of V5 during time period T3.

In the previously described embodiments, the SSL signal can be reduced to the leakage minimization voltage V4 to minimize charge leakage to bitline 306, thereby maximizing the boosted channel voltage prior to localized boosting of the selected memory cell channel to the secondary boosted voltage level. During localized boosting, some charge can leak from the channel of the selected memory cell through its two immediately adjacent memory cells. This is caused by dropping the wordlines of the adjacent cells from V2 to V3, which reduces the channel voltage of their respective memory cells. Therefore, while still turned off, some of the charge will leak to the other memory cells connected to the lower wordlines.

According to a charge leakage reduction embodiment of the present invention, the lower wordlines are driven with voltages different than the upper wordlines for reducing charge leakage from the locally boosted channel of the selected memory cell. An embodiment of this scheme is shown in FIG. 13.

Figure 13:
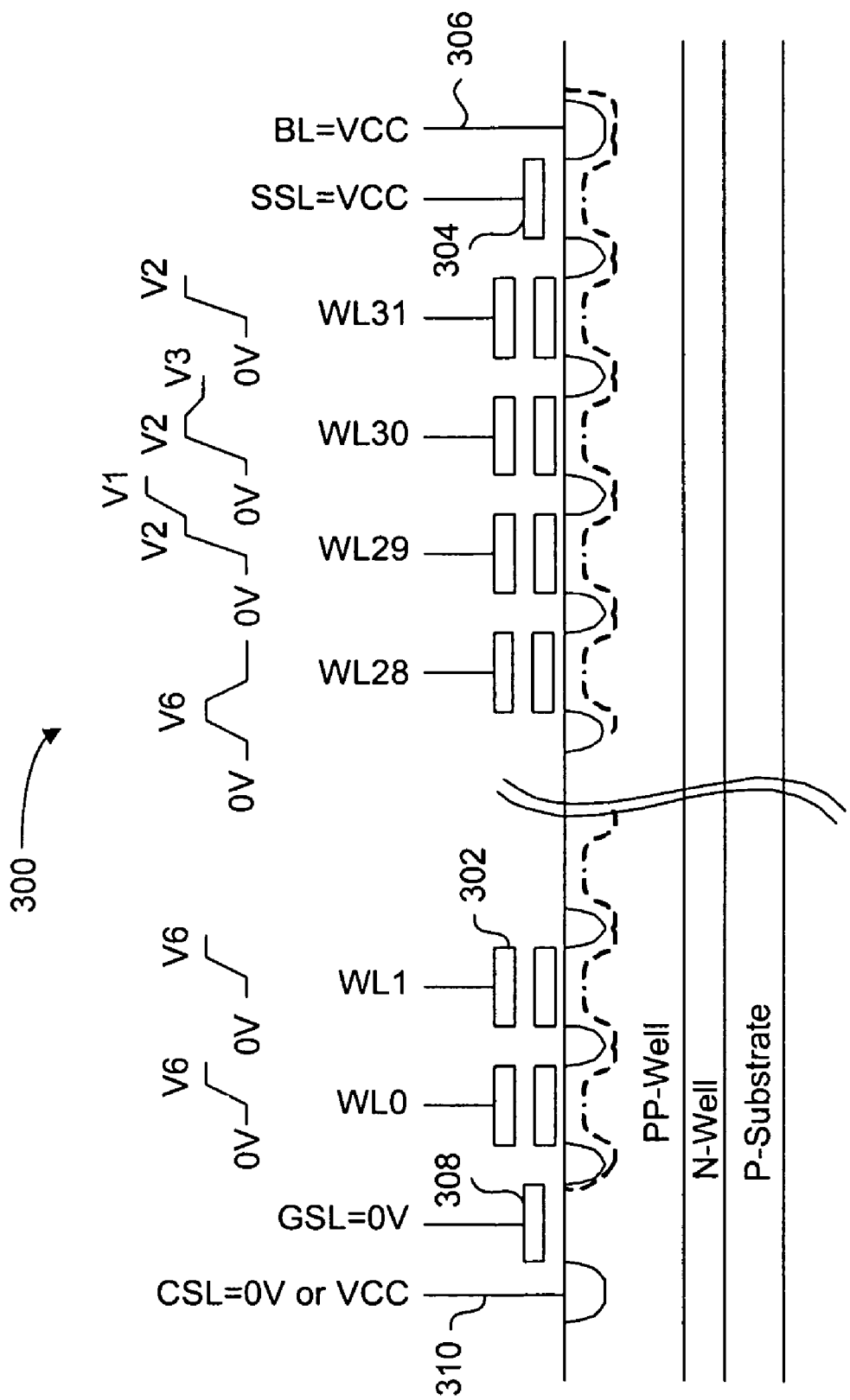
FIG. 13 is a simplified cross sectional view of a NAND string showing applied gate voltages, according to an embodiment of the present invention.

FIG. 13 shows the same NAND string 300 shown in FIG. 7a, and includes annotations to show relative voltage levels applied to specific wordlines. The voltages applied to the selected wordline WL29, and upper wordlines WL30 and WL31 can be the same as previously shown and described for the embodiment of FIG. 7a. In the present embodiment the lower wordlines WL0-WL28 are driven to a pass voltage of V6, and the immediately adjacent wordline WL28 is then driven down to a low voltage level. By example, the low voltage can be 0V, 0.1V, 0.2V.

Figure 14:
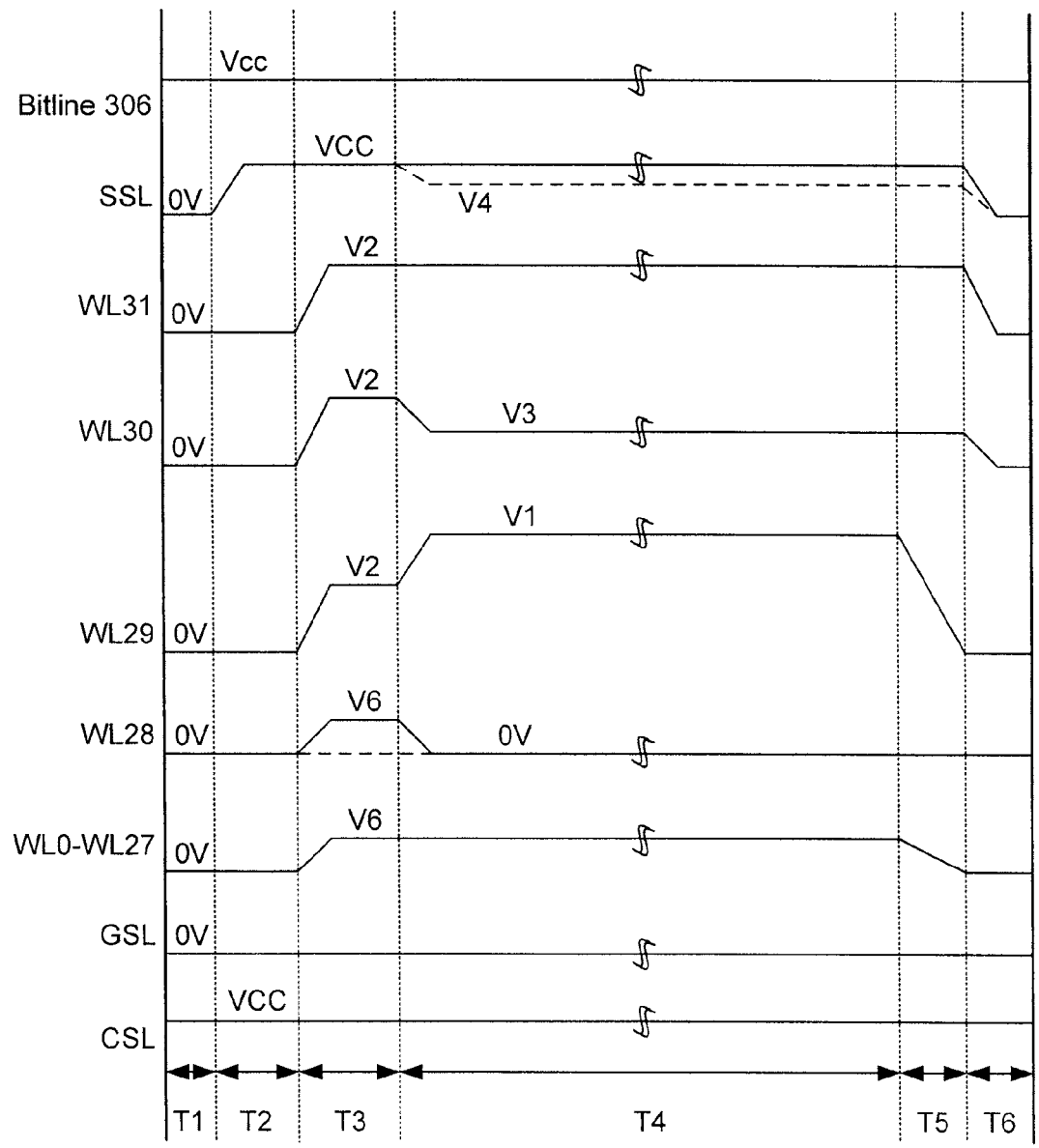
FIG. 14 is a sequence diagram further illustrating the sequence of the voltages being applied to the NAND string of FIG. 13.

FIG. 14 is a sequence diagram illustrating the program inhibit sequence according to the currently described embodiment. The sequence during time period T1 and T2 is the same as previously described for FIG. 7b. At time period T3, the upper wordlines WL30-WL31, and the selected wordline, are driven to the first pass voltage V2. The lower wordlines WL0-WL28 are driven to a second pass voltage V6. In another embodiment, second pass voltage V6 is less than first pass voltage V2, but higher than the threshold of a programmed memory cell. A primary boosted voltage will still result because charge is distributed, or shared, throughout the entire channel of the NAND memory cell string. At the beginning of time period T4, the selected wordline WL29 is raised to the programming voltage V1 while the upper adjacent wordline WL30 is reduced to the decoupling voltage V3. The lower adjacent wordline WL28 on the other hand, is reduced to an off voltage of 0V. The effect of the aforementioned sequence and voltage levels will now be discussed.

If the memory transistor connected to WL28 has been programmed with a positive threshold, then it will be electrically turned off when WL28 falls below the positive threshold, such as to 0V for example. On the other hand, if the memory cell is still erased (negative threshold), then the off voltage of even 0V can turn on the memory cell. However, since the second pass voltage V6 was applied to the lower wordlines, the channels of the lower memory cells are boosted to the lower primary boosted voltage. Hence the source terminal (drain terminal is connected to selected memory cell) of the memory cell connected to WL28 is positive, thereby turning off the memory cell. By closing the leakage path from the boosted channel of the selected transistor to the lower memory cells, local boosting efficiency is further improved. Those skilled in the art will understand that the off voltage is not restricted to being 0V, and that any low voltage effective for minimizing charge leakage through the memory cell connected to WL28 can be used.

According to alternate embodiments, string select signal SSL can be reduced to V4 at the beginning of time period T4 as shown by the dashed line in the trace of SSL, and WL28 can be set to remain at the off voltage during time period T3, as shown by the dashed line in the trace of WL28. Advantages of keeping the adjacent lower wordline (such as WL28 in the described embodiment) at the off voltage include a reduction in voltage consumption and coupling capacitance. Voltage consumption is reduced since the wordline driver does not need to raise and lower the wordline. As wordline pitches are decreased to improve memory array packing density, capacitive coupling between adjacent wordlines becomes more pronounced as wordlines rise and fall. Since the adjacent lower wordline does not change between time period T3 and T4, capacitive coupling is reduced. The second pass voltage V6 can be a low voltage, such as a read voltage level used for Flash read operations, and is lower than V3.

Figure 15:
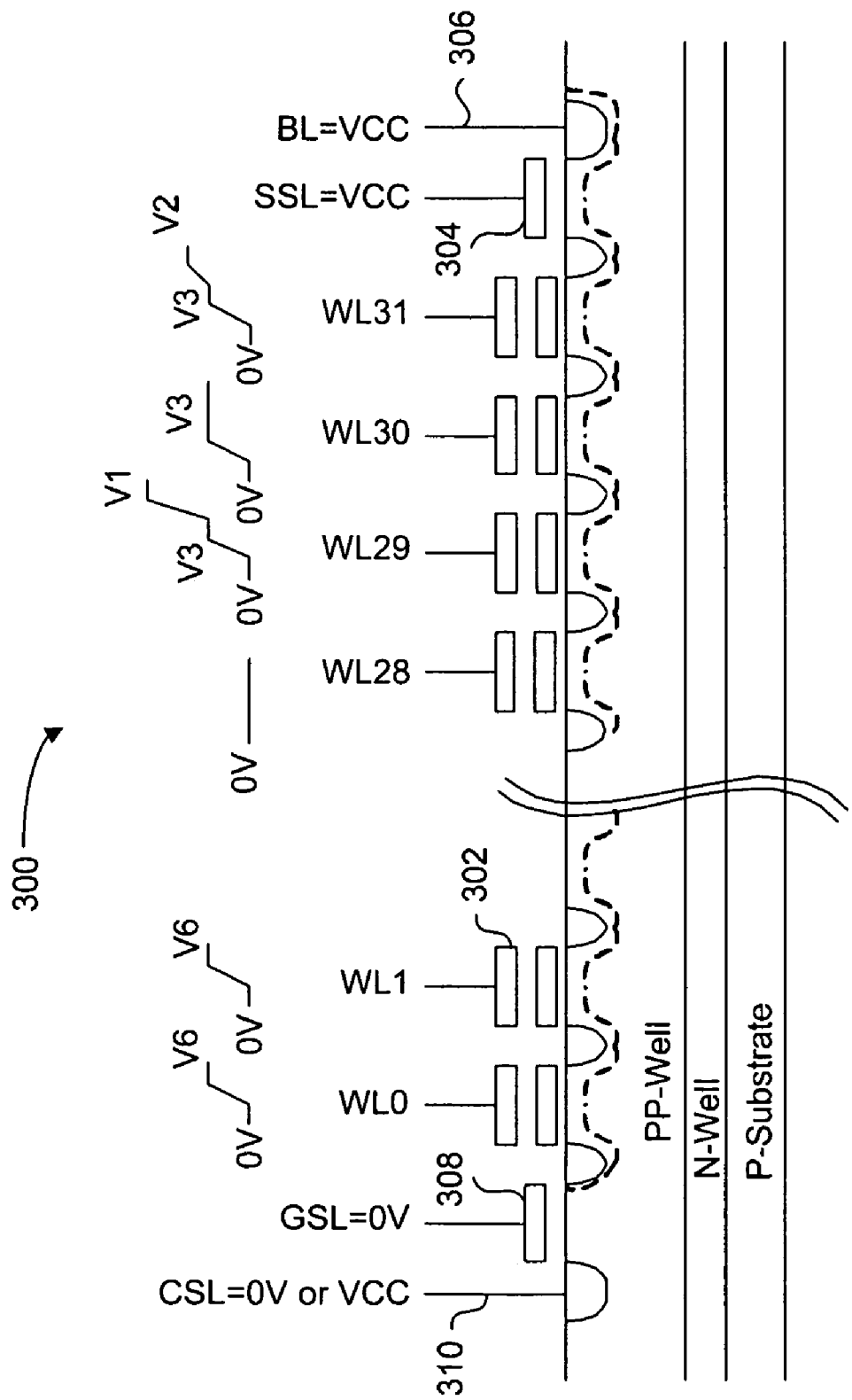
FIG. 15 is a simplified cross sectional view of a NAND string showing applied gate voltages, according to an embodiment of the present invention; and, FIG. 16 is a sequence diagram further illustrating the sequence of the voltages being applied to the NAND string of FIG. 15.

FIG. 15 is another embodiment of the present invention, combining some of the features described in the previous embodiments. FIG. 15 shows the same NAND string 300 shown in FIG. 13, and includes annotations to show relative voltage levels applied to specific wordlines. In particular, the present example uses the charge leakage reduction scheme of FIG. 13, a variant of the high differential local boosting scheme of FIG. 11, and a novel decoupling scheme. In the novel decoupling scheme, the first and second upper adjacent memory cells of NAND string 300 are controlled using the previously established voltages for decoupling the selected memory cell from the NAND string 300.

Figure 16:
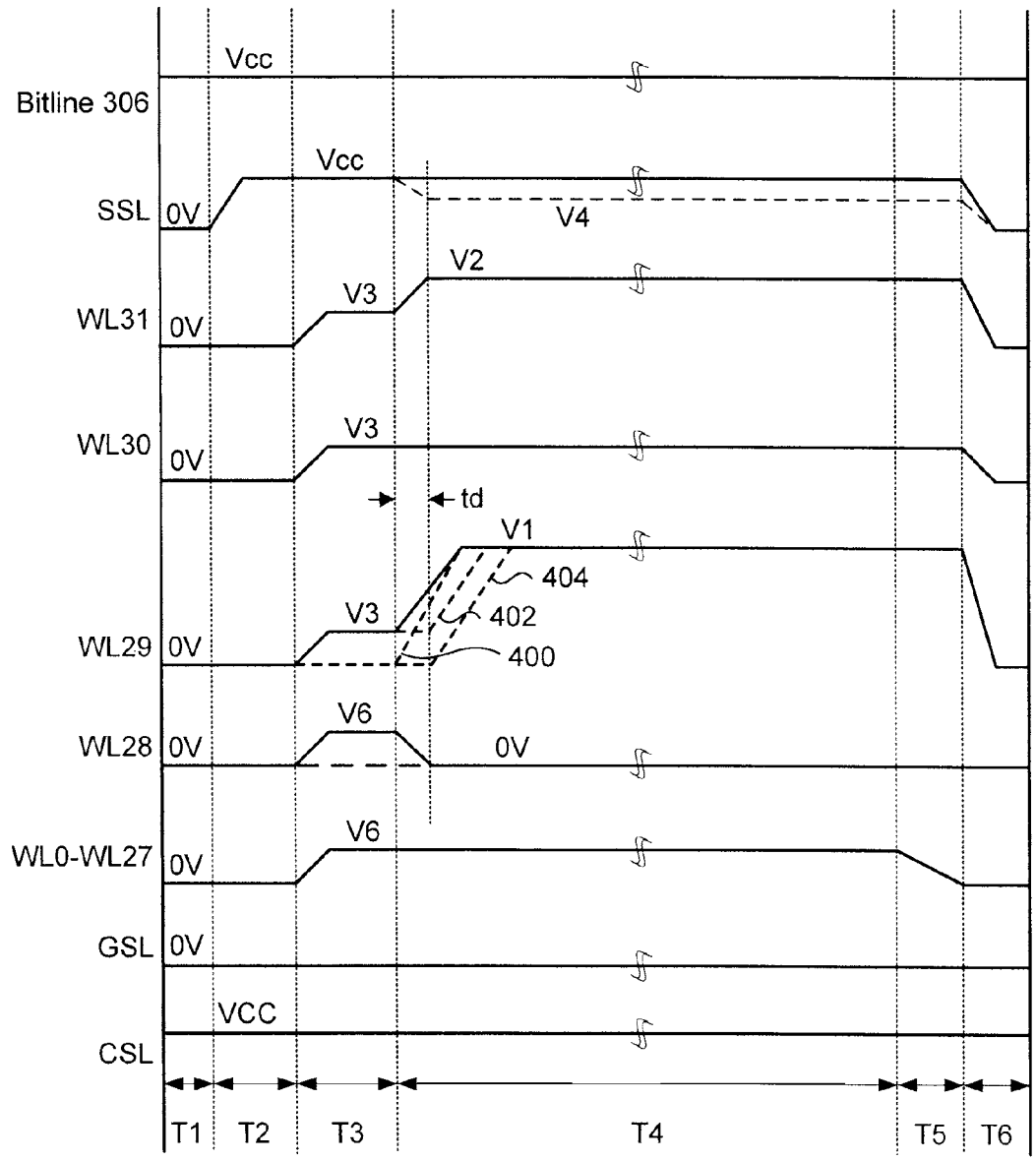

FIG. 16 is a sequence diagram illustrating the program inhibit sequence according to the currently described embodiment. FIG. 16 shows relative timing variations of WL29, and an alternate pass voltage of WL29, which will be described later. The sequence during time period T1 and T2 is the same as previously described for FIG. 13. At time period T3, all the upper wordlines (WL30 and WL31 in the present example) and the selected wordline WL29, are driven to the decoupling voltage V3. In effect, V3 is being used in time period T3 as a first pass voltage. Meanwhile, the lower wordlines are driven to the second pass voltage V6, including adjacent lower wordline WL28 which remains at the default off voltage level (0V for example). Hence the channel of NAND string 300 is now effectively restricted to the memory cells connected to wordlines WL29-WL31, which is raised to the primary boosted voltage.

At the beginning of time period T4, the selected wordline WL29 is raised to the programming voltage V1 while the upper adjacent wordline WL30 remains at V3. At about the same time, all the upper wordlines except the upper adjacent wordline WL31 are driven up to the first pass voltage of V2. In this embodiment, the memory cell connected to WL30 is electrically turned off when WL29 is raised to V1 and when WL31 is raised to V2, and WL28 is reduced to the off voltage in time period T4. In an alternate embodiment, the string select signal SSL can be reduced to V4 at the beginning of time period T4 as shown by the dashed line in the trace of SSL. The following relational expressions summarize the relative constraints of the voltage levels used in the embodiments of FIGS. 13 to 16.

$$V3 < V2 < V1 \quad (1)$$

$$0V < V4 < V3 \quad (2)$$

$$0V < V6 < V3 \quad (3)$$

Therefore, there is virtually no pass disturbance experienced by the lower memory cells due to the low voltage level being applied to their gates.

In FIG. 16, WL29 can be initially set to V3 during time period T3 to increase the voltage difference between V3 and V1, and to provide high differential local boosting similar to that achievable by the embodiment of FIG. 11. Alternatively, local boosting can be maximized by maintaining WL29 at 0V during time period T3, and then driving WL29 directly to V1 during time period T4. This is shown by dashed line 400. It is noted that the memory cell connected to WL29 is an erased cell having a negative threshold voltage.

The previously shown sequence diagrams are intended to show the general timing relationships for the application of specific voltages to selected and unselected wordlines. However, the relative timing between driving the selected wordline from the first pass voltage (or 0V) to the programming voltage (V1) and control of the immediately adjacent wordlines can be further refined as follows. With reference to FIG. 10 for example, the selected wordline WL29 can be driven to V1 at the same time the adjacent wordlines WL28 and WL30 are reduced to V3. In other words, the selected memory cell is decoupled from the rest of the NAND memory cells as the V1 programming voltage is applied. During the initial part of the transition of WL29 to V1, some off the charge resulting from the WL29 boost will leak away through adjacent memory cells before these cells have been fully turned off by voltage V3.

To maximize local boosting efficiency of the selected memory cell during time period T4, the selected wordline can be driven to V1 shortly after the selected memory cell is decoupled from the other memory cells. In the embodiment of FIG. 16 for example, WL29 can remain at V3 until after WL28 reaches 0V, as shown in trace 402. More specifically as shown in FIG. 16, WL29 can be driven to V1 after a delay time td after WL28 starts to drop to 0V. Delay time td can be any preset value. For the embodiment where WL29 remains at 0V during time period T3, WL29 can remain at 0V until after WL28 reaches 0V after delay time td, as shown in trace 404. Those skilled in the art will understand that the relative timing between the selected wordline with the other wordlines can be configured as required to minimize charge leakage or to maximize local channel boosting.

In the previously described embodiments, V2 is a value optimized for minimizing program disturb in unselected memory cells, and for maximizing the primary boosted channel level. Those skilled in the art will understand that a practical V2 value will depend on various design and fabrication parameters of the memory cells, and can therefore be determined through simulation or modeling.

The presently described embodiments of the invention can be used in standard stepped programming schemes. According to an embodiment of the present invention, the selected memory cell program voltage V1 will be an initial programming voltage applied to the gate of the selected memory cell. Thereafter, the voltage level of V1 can be iteratively increased by predetermined voltage steps while the pass voltages and decoupling voltages applied to the other wordlines are kept at the same voltage levels. By fixing these voltage levels during the incremental programming steps, chip size and power consumption can be reduced relative to prior art programming schemes.

In the described embodiments, the off voltage applied to the adjacent lower wordline (ie. WL28) can be 0V, or any low voltage that is selected based on the chosen design and fabrication parameters for the memory cells, and the boosted channel voltage resulting from the application of the V6 pass voltage.

The wordline and control line (SSL and GSL) voltages and sequence of application can be controlled by wordline driver circuits, and associated wordline logic circuits, such as decoders. Those skilled in the art will understand that well known multi-voltage level wordline driver circuits can be easily modified to provide the voltage levels used in the illustrated program inhibit sequence embodiments. The decoding logic can ensure that for any selected wordline, the immediately adjacent wordlines (or control lines) are controlled in the disclosed manner for decoupling the selected memory cell from the NAND string.

Therefore, the aforementioned wordline/control line control scheme is effective for programming selected memory cells from an erased state, while inhibiting programming in selected memory cells where the erase state is to be retained. Since a lower pass voltage is used relative to the prior art program inhibit schemes, program disturb in unselected memory cells is minimized. Since the selected memory cell can be decoupled and isolated from the other memory cells in the NAND string, its channel can be efficiently boosted to a level for inhibiting F-N tunneling and random page programming can be performed.

The previously described embodiments of the program inhibit scheme can be implemented for any NAND string based Flash memory. Those of skill in the art will understand that the specific voltage levels used in the scheme are unique to a particular process and NAND cell design. The voltage level transitions shown in FIGS. 7b to 16 are intended to provide a general sequence of events, and not intended to provide specific timing relationships between signals. Persons skilled in the art will appreciate that minor timing differences between signals can occur without departing from the scope of the invention.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A memory array having a NAND string coupled between a bitline and a sourceline precharged to a program inhibit voltage during a program operation for inhibiting programming of a selected memory cell, comprising:
    a string select transistor driven to a voltage level for coupling the program inhibit voltage of the bitline to all memory cells of the NAND string;
    lower memory cells between the selected memory cell and the sourceline driven to a first pass voltage in a first time period;
    upper memory cells between the selected memory cell and the bitline driven to a second pass voltage in the first time period for precharging the upper memory cell channels to a primary boosted voltage; and
    a selected memory cell driven from a third pass voltage in the first time period for precharging the selected memory cell channel to the primary boosted voltage, to a programming voltage greater than the first pass voltage in a second time period following the first time period.

2. The memory array of claim 1, wherein the first pass voltage, the second pass voltage, and the third pass voltage are the same.

3. The memory array of claim 1, wherein the third pass voltage is less than the first pass voltage.

4. The memory array of claim 1, wherein the upper memory cells include an upper memory cell adjacent the selected memory cell electrically turned off during the second time period.

5. The memory array of claim 4, wherein the upper memory cell is driven to a decoupling voltage less than the second pass voltage and greater than 0V in the second time period.

6. The memory array of claim 1, wherein the lower memory cells include a lower memory cell adjacent the selected memory cell electrically turned off during the second time period.

7. The memory array of claim 6, wherein the lower memory cell is driven to a decoupling voltage less than the second pass voltage and greater than 0V in the second time period.

8. The memory array of claim 1, wherein the string select transistor is driven to the program inhibit voltage before the first time period for a duration extending into the second time period.

9. The memory array of claim 1, wherein the string select transistor driven to the program inhibit voltage before the first time period.

10. The memory array of claim 9, wherein the string select transistor is driven to a leakage minimization voltage in the first time period for a duration extending into the second time period.

11. The memory array of claim 6, wherein the first pass voltage is less than the second pass voltage, and greater than a threshold voltage corresponding to a programmed memory cell.

12. The memory array of claim 11, wherein the lower memory cell adjacent the selected memory cell is driven to 0V in the second time period.

13. The memory array of claim 1, wherein the first pass voltage is greater than the second pass voltage.

14. The memory array of claim 13, wherein the upper memory cells include a first upper memory cell adjacent the selected memory cell and a second upper memory cell adjacent the first upper memory cell, the first upper memory cell electrically turning off during the second time period when the second upper memory cell is driven to a fourth pass voltage greater than the second pass voltage.

15. The memory array of claim 14, wherein the lower memory cells include a first lower memory cell adjacent the selected memory cell and a second lower memory cell adjacent the first lower memory cell, the first lower memory cell electrically turning off during the second time period.

16. The memory array of claim 15, wherein the first lower memory cell is driven to 0V.

17. The memory array of claim 16, wherein the selected memory cell is driven to the programming voltage after a predetermined delay after the first lower memory cell is driven towards 0V.

* * * * *